(12) United States Patent
Suh et al.

(10) Patent No.: US 12,310,079 B2
(45) Date of Patent: May 20, 2025

(54) SEMICONDUCTOR DEVICES INCLUDING GATE SPACER

(71) Applicant: SAMSUNG ELECTRONICS CO., LTD., Suwon-si (KR)

(72) Inventors: Bongseok Suh, Seoul (KR); Daewon Kim, Hwaseong-si (KR); Beomjin Park, Hwaseong-si (KR); Sukhyung Park, Seoul (KR); Sungil Park, Suwon-si (KR); Jaehoon Shin, Suwon-si (KR); Bongseob Yang, Suwon-si (KR); Junggun You, Ansan-si (KR); Jaeyun Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/483,413

(22) Filed: Oct. 9, 2023

(65) Prior Publication Data
US 2024/0038873 A1 Feb. 1, 2024

Related U.S. Application Data

(63) Continuation of application No. 17/060,193, filed on Oct. 1, 2020, now Pat. No. 11,810,964.

(30) Foreign Application Priority Data

Apr. 7, 2020 (KR) .......................... 10-2020-0042140

(51) Int. Cl.
*H10D 64/01* (2025.01)
*H10D 30/00* (2025.01)
(Continued)

(52) U.S. Cl.
CPC ....... *H10D 64/021* (2025.01); *H10D 30/6757* (2025.01); *H10D 62/235* (2025.01);
(Continued)

(58) Field of Classification Search
CPC .......... H01L 29/6653; H01L 29/66553; H01L 29/6656; H01L 29/66689; H01L 29/66719;
(Continued)

(56) References Cited

U.S. PATENT DOCUMENTS

| | | | | |
|---|---|---|---|---|
| 5,783,479 A | * | 7/1998 | Lin ....................... | H10D 64/663 257/E21.44 |
| 6,190,996 B1 | * | 2/2001 | Mouli .................. | H10D 64/679 257/E21.573 |

(Continued)

FOREIGN PATENT DOCUMENTS

| | | |
|---|---|---|
| JP | 2012-109425 | 6/2012 |
| KR | 10-1996-0012321 | 4/1996 |

(Continued)

OTHER PUBLICATIONS

Office Action in Taiwanese Appln. No. 109138823, mailed on Jun. 28, 2024, 21 pages (with English translation).

(Continued)

*Primary Examiner* — Maliheh Malek
(74) *Attorney, Agent, or Firm* — Fish & Richardson P.C.

(57) ABSTRACT

A semiconductor device includes a first active region defined on a substrate, a first gate electrode across the first active region, a first drain region in the first active region at a position adjacent to the first gate electrode, an undercut region between the first active region and the first gate electrode, and a first gate spacer on a side surface of the first gate electrode and extending into the undercut region.

19 Claims, 28 Drawing Sheets

(51) Int. Cl.
*H10D 30/01* (2025.01)
*H10D 30/67* (2025.01)
*H10D 62/17* (2025.01)
*H10D 64/27* (2025.01)
*H10D 84/01* (2025.01)
*H10D 84/03* (2025.01)
*H01L 21/28* (2025.01)

(52) U.S. Cl.
CPC ......... *H10D 64/018* (2025.01); *H10D 64/518* (2025.01); *H01L 21/28141* (2013.01); *H10D 30/0293* (2025.01); *H10D 30/204* (2025.01); *H10D 62/292* (2025.01); *H10D 84/0147* (2025.01); *H10D 84/038* (2025.01)

(58) Field of Classification Search
CPC ......... H01L 29/4983; H01L 29/51–518; H01L 21/28132–2815; H01L 21/823468; H01L 21/823864; H01L 29/78696; H01L 29/7727; H01L 29/36–365
See application file for complete search history.

(56) References Cited

U.S. PATENT DOCUMENTS

| | | | |
|---|---|---|---|
| 6,399,469 B1 * | 6/2002 | Yu | H01L 21/28123 438/738 |
| 6,524,901 B1 * | 2/2003 | Trivedi | H01L 21/28114 438/303 |
| 6,528,854 B1 * | 3/2003 | Yoshida | H10D 30/0227 438/304 |
| 6,716,689 B2 * | 4/2004 | Bae | H01L 29/7833 438/303 |
| 6,838,326 B2 * | 1/2005 | Kwon | H01L 21/28061 438/362 |
| 6,844,602 B2 * | 1/2005 | Kwon | H01L 21/28061 257/E21.2 |
| 6,885,072 B1 * | 4/2005 | Jeng | H10D 30/691 257/388 |
| 7,312,125 B1 * | 12/2007 | Xiang | H10D 64/018 257/E21.429 |
| 7,402,875 B2 * | 7/2008 | Datta | H01L 21/28114 257/388 |
| 8,273,625 B2 * | 9/2012 | Shen | H01L 29/7881 438/257 |
| 8,314,022 B1 * | 11/2012 | Foster | H01L 21/32134 438/591 |
| 8,617,956 B2 * | 12/2013 | Doris | H10D 62/151 257/E21.409 |
| 8,722,472 B2 * | 5/2014 | Chang | H01L 29/78696 438/154 |
| 8,803,223 B2 * | 8/2014 | Lin | H10D 64/037 257/324 |
| 8,969,963 B2 * | 3/2015 | Basker | H10D 30/62 257/347 |
| 9,041,009 B2 * | 5/2015 | Doris | H10D 30/0275 257/E21.255 |
| 9,064,723 B2 * | 6/2015 | Won | H10D 84/0147 |
| 9,064,804 B2 * | 6/2015 | Fumitake | H10D 30/0413 |
| 9,276,064 B1 * | 3/2016 | Zang | H10D 30/62 |
| 9,331,185 B2 * | 5/2016 | Huang | H10D 30/694 |
| 9,570,551 B1 * | 2/2017 | Balakrishnan | H01L 21/30612 |
| 9,768,079 B2 * | 9/2017 | Doris | H01L 21/02532 |
| 9,812,567 B1 * | 11/2017 | Basker | H10D 62/292 |
| 9,911,599 B2 * | 3/2018 | Oxland | H10D 30/0614 |
| 9,991,285 B2 * | 6/2018 | Chang | H10D 84/038 |
| 9,991,352 B1 * | 6/2018 | Frougier | H10D 30/62 |
| 10,074,726 B2 * | 9/2018 | You | H01L 27/0207 |
| 10,096,607 B1 * | 10/2018 | Guillorn | H10D 30/62 |
| 10,229,983 B1 * | 3/2019 | Bu | H10D 64/685 |
| 10,256,252 B1 * | 4/2019 | Kanazawa | H10B 43/27 |
| 10,269,920 B2 * | 4/2019 | Cheng | H01L 29/41725 |
| 10,297,664 B2 * | 5/2019 | Xie | H10D 62/121 |
| 10,355,102 B2 * | 7/2019 | Cheng | H10D 30/6741 |
| 10,374,059 B2 * | 8/2019 | Cheng | H01L 29/775 |
| 10,535,733 B2 * | 1/2020 | Cheng | H10D 30/6757 |
| 10,566,245 B2 * | 2/2020 | Kwon | H01L 29/775 |
| 10,651,291 B2 * | 5/2020 | Frougier | H01L 29/0653 |
| 10,804,165 B2 * | 10/2020 | Seo | H10D 30/6757 |
| 10,991,811 B2 * | 4/2021 | Cheng | H01L 29/66439 |
| 11,038,044 B2 * | 6/2021 | Cheng | H01L 29/42392 |
| 11,158,727 B2 * | 10/2021 | Wang | H01L 29/42392 |
| 11,227,917 B1 * | 1/2022 | Chung | H01L 29/66545 |
| 11,227,956 B2 * | 1/2022 | Yeong | H01L 29/7848 |
| 11,380,590 B2 * | 7/2022 | Chang | H01L 21/32137 |
| 11,387,367 B2 * | 7/2022 | Shin | H10D 64/017 |
| 11,450,738 B2 * | 9/2022 | Ma | H01L 29/42392 |
| 11,495,682 B2 * | 11/2022 | Yang | H01L 29/42392 |
| 11,653,504 B2 * | 5/2023 | Kim | G11C 7/12 257/5 |
| 11,670,680 B2 * | 6/2023 | Jung | H10D 62/118 257/401 |
| 11,810,964 B2 * | 11/2023 | Suh | H01L 29/66439 |
| 2002/0173128 A1 * | 11/2002 | Muller | H01L 29/6656 257/E21.205 |
| 2003/0094662 A1 * | 5/2003 | Bae | H10D 30/601 257/E21.205 |
| 2003/0143791 A1 * | 7/2003 | Cheong | H10D 64/018 257/E29.162 |
| 2003/0235943 A1 * | 12/2003 | Trivedi | H01L 29/7833 257/E21.205 |
| 2004/0007724 A1 * | 1/2004 | Murthy | H01L 29/41733 257/E21.415 |
| 2004/0092075 A1 * | 5/2004 | Yeo | H10D 64/021 438/303 |
| 2004/0115896 A1 * | 6/2004 | Bae | H01L 21/28114 438/408 |
| 2004/0132236 A1 * | 7/2004 | Doris | H01L 29/42376 257/E21.345 |
| 2004/0198003 A1 * | 10/2004 | Yeo | H10D 30/62 257/E29.151 |
| 2005/0090066 A1 * | 4/2005 | Zhu | H10D 64/017 257/E21.429 |
| 2005/0104143 A1 * | 5/2005 | Jeng | H01L 29/7923 257/E21.21 |
| 2005/0148147 A1 * | 7/2005 | Keating | H01L 21/30608 257/E21.235 |
| 2005/0176191 A1 * | 8/2005 | Kumar | H01L 21/28114 257/E21.252 |
| 2005/0282352 A1 * | 12/2005 | Cho | H01L 21/823481 257/E21.628 |
| 2006/0001095 A1 * | 1/2006 | Doris | H10D 30/6757 438/149 |
| 2006/0008973 A1 * | 1/2006 | Phua | H10D 84/0177 257/E21.639 |
| 2006/0145273 A1 * | 7/2006 | Curello | H10D 30/791 257/E29.267 |
| 2006/0163662 A1 * | 7/2006 | Kinoshita | H10D 84/0179 257/E21.426 |
| 2006/0177983 A1 * | 8/2006 | Trivedi | H01L 29/7833 257/E21.205 |
| 2007/0018238 A1 * | 1/2007 | Ono | H01L 29/42368 257/327 |
| 2007/0040223 A1 * | 2/2007 | Datta | H10D 64/518 257/E21.205 |
| 2007/0102767 A1 | 5/2007 | Cho et al. | |
| 2008/0153222 A1 * | 6/2008 | Lee | H10D 64/037 438/257 |
| 2008/0203477 A1 * | 8/2008 | Yamazaki | H01L 29/7881 257/E29.302 |
| 2009/0212376 A1 * | 8/2009 | Adkisson | H10D 64/516 257/E21.409 |
| 2009/0227082 A1 * | 9/2009 | Shin | H10D 84/017 438/294 |
| 2010/0038705 A1 * | 2/2010 | Doris | H10D 30/601 438/303 |
| 2012/0043623 A1 * | 2/2012 | Doris | H01L 21/28114 438/300 |

(56) References Cited

U.S. PATENT DOCUMENTS

| | | | | |
|---|---|---|---|---|
| 2012/0299058 | A1* | 11/2012 | Huang | H01L 29/7848 257/190 |
| 2013/0153929 | A1* | 6/2013 | Doris | H10D 30/797 257/77 |
| 2013/0299916 | A1* | 11/2013 | Won | H10D 84/83 257/392 |
| 2014/0110784 | A1* | 4/2014 | Jagannathan | H01L 29/78 257/E21.409 |
| 2014/0151638 | A1* | 6/2014 | Chang | H10D 84/038 257/27 |
| 2014/0151639 | A1* | 6/2014 | Chang | H01L 29/42392 257/27 |
| 2014/0159142 | A1* | 6/2014 | Lim | H10D 64/017 438/270 |
| 2014/0191299 | A1* | 7/2014 | Wang | H10D 64/017 438/585 |
| 2014/0353734 | A1* | 12/2014 | Xie | H10D 84/038 257/288 |
| 2015/0056775 | A1* | 2/2015 | Huang | H10D 30/694 438/287 |
| 2015/0263128 | A1* | 9/2015 | Basker | H10D 84/0142 257/288 |
| 2015/0311310 | A1* | 10/2015 | Won | H01L 21/823456 438/294 |
| 2015/0340490 | A1* | 11/2015 | An | H10D 30/62 257/401 |
| 2015/0364490 | A1* | 12/2015 | Oda | H01L 27/1207 438/154 |
| 2016/0056233 | A1* | 2/2016 | Mitsuiki | H10D 84/83 257/401 |
| 2016/0099338 | A1* | 4/2016 | Chang | H10D 64/017 438/157 |
| 2016/0225867 | A1* | 8/2016 | Kim | H10D 84/853 |
| 2016/0343706 | A1* | 11/2016 | Chang | H01L 21/823431 |
| 2017/0110542 | A1 | 4/2017 | Lee et al. | |
| 2017/0110554 | A1* | 4/2017 | Tak | H10D 30/031 |
| 2017/0194213 | A1* | 7/2017 | Ching | H10D 84/013 |
| 2017/0213826 | A1* | 7/2017 | Kim | H01L 29/42376 |
| 2017/0271514 | A1* | 9/2017 | Kittl | H10D 64/62 |
| 2017/0288018 | A1* | 10/2017 | Tung | H01L 29/42392 |
| 2017/0352744 | A1* | 12/2017 | Basker | H01L 21/31116 |
| 2017/0358457 | A1* | 12/2017 | Jang | H10D 64/017 |
| 2017/0365604 | A1* | 12/2017 | Suh | H10D 84/038 |
| 2018/0006139 | A1* | 1/2018 | Seo | H10D 62/116 |
| 2018/0151452 | A1* | 5/2018 | Doornbos | H10D 30/6735 |
| 2018/0175167 | A1* | 6/2018 | Reboh | H10D 30/6735 |
| 2018/0190829 | A1* | 7/2018 | Song | H01L 21/02603 |
| 2018/0315667 | A1* | 11/2018 | Kwon | H01L 27/092 |
| 2018/0350949 | A1* | 12/2018 | Chang | H01L 29/42376 |
| 2018/0358435 | A1* | 12/2018 | Mochizuki | H10D 64/512 |
| 2019/0043725 | A1* | 2/2019 | Chang | H10D 64/516 |
| 2019/0058052 | A1* | 2/2019 | Frougier | H10D 62/292 |
| 2019/0067441 | A1* | 2/2019 | Yang | H10D 64/518 |
| 2019/0074362 | A1* | 3/2019 | Lee | H10D 62/121 |
| 2019/0088756 | A1* | 3/2019 | Fang | H01L 21/823842 |
| 2019/0131171 | A1* | 5/2019 | Gwak | H01L 29/785 |
| 2019/0131304 | A1* | 5/2019 | Leobandung | H10D 62/021 |
| 2019/0148515 | A1* | 5/2019 | Cheng | H01L 29/78618 257/347 |
| 2019/0164968 | A1* | 5/2019 | Leib | H01L 23/53209 |
| 2019/0165139 | A1* | 5/2019 | Fan | H10D 30/62 |
| 2019/0165142 | A1* | 5/2019 | Basker | H01L 21/32137 |
| 2019/0221483 | A1* | 7/2019 | Mulfinger | H01L 29/0847 |
| 2019/0267494 | A1* | 8/2019 | Kim | H01L 21/02603 |
| 2019/0348523 | A1* | 11/2019 | Hiblot | H10D 64/6757 |
| 2019/0378906 | A1* | 12/2019 | Loubet | H01L 21/823807 |
| 2020/0006356 | A1 | 1/2020 | Ando et al. | |
| 2020/0044045 | A1* | 2/2020 | Wang | H01L 29/66439 |
| 2020/0044072 | A1* | 2/2020 | Chiang | H10D 30/62 |
| 2020/0105929 | A1* | 4/2020 | Zhang | H10D 62/121 |
| 2020/0119190 | A1* | 4/2020 | Cheng | H10D 30/025 |
| 2020/0126798 | A1* | 4/2020 | Lin | H10D 64/017 |
| 2020/0220015 | A1* | 7/2020 | Jang | H01L 21/02603 |
| 2020/0220018 | A1* | 7/2020 | Jang | H10D 30/6735 |
| 2020/0227534 | A1* | 7/2020 | Chiang | H01L 29/78696 |
| 2020/0279779 | A1* | 9/2020 | Li | H01L 21/2251 |
| 2020/0388707 | A1* | 12/2020 | Shen | H01L 21/823456 |
| 2020/0395446 | A1* | 12/2020 | Yi | H01L 29/0847 |
| 2021/0036121 | A1* | 2/2021 | Lim | H10D 30/6735 |
| 2021/0057432 | A1* | 2/2021 | Lu | H01L 21/26513 |
| 2021/0098588 | A1* | 4/2021 | Chung | H01L 29/78696 |
| 2021/0098605 | A1* | 4/2021 | Wang | H10D 62/292 |
| 2021/0126135 | A1* | 4/2021 | Lee | H10D 30/031 |
| 2021/0202478 | A1* | 7/2021 | Guha | H01L 27/088 |
| 2021/0210634 | A1* | 7/2021 | Lee | H10D 64/691 |
| 2021/0234002 | A1* | 7/2021 | Lee | H01L 29/775 |
| 2021/0257499 | A1* | 8/2021 | Shin | H01L 29/42376 |
| 2021/0265349 | A1* | 8/2021 | Chung | H10D 64/021 |
| 2021/0273047 | A1* | 9/2021 | Kuan | H01L 29/0847 |
| 2021/0296323 | A1* | 9/2021 | Zheng | H10D 84/856 |
| 2021/0328013 | A1* | 10/2021 | Ando | H10D 64/018 |
| 2021/0384307 | A1* | 12/2021 | Ma | H10D 30/6757 |
| 2022/0020742 | A1* | 1/2022 | You | H01L 21/76232 |
| 2022/0037319 | A1* | 2/2022 | Kim | H10D 30/6735 |
| 2022/0059530 | A1* | 2/2022 | Song | H01L 21/823431 |
| 2022/0123144 | A1* | 4/2022 | Zhang | H01L 29/78696 |
| 2022/0181489 | A1* | 6/2022 | You | H01L 27/0886 |
| 2022/0190159 | A1* | 6/2022 | Paul | H01L 29/66439 |
| 2022/0216348 | A1* | 7/2022 | Kim | H01L 29/42392 |
| 2022/0231139 | A1* | 7/2022 | Ju | H10D 30/62 |
| 2022/0238707 | A1* | 7/2022 | Yang | H10D 64/021 |
| 2022/0246726 | A1* | 8/2022 | More | H10D 30/031 |
| 2022/0302316 | A1* | 9/2022 | Shin | H10D 62/021 |
| 2022/0320312 | A1* | 10/2022 | Park | H10D 30/6211 |
| 2022/0328621 | A1* | 10/2022 | Kuan | H01L 29/78696 |
| 2022/0328698 | A1* | 10/2022 | Lin | H10D 30/031 |
| 2022/0359704 | A1* | 11/2022 | Su | H01L 21/0262 |
| 2022/0392894 | A1* | 12/2022 | More | H01L 29/66439 |
| 2022/0393012 | A1* | 12/2022 | Peng | H01L 29/78696 |
| 2022/0406606 | A1* | 12/2022 | Lin | H01L 21/28185 |
| 2022/0416042 | A1* | 12/2022 | Hsu | H01L 29/401 |
| 2022/0416045 | A1* | 12/2022 | Park | H01L 27/0688 |
| 2023/0051602 | A1* | 2/2023 | Park | H10D 64/021 |
| 2023/0058459 | A1* | 2/2023 | More | H01L 29/66439 |
| 2023/0064376 | A1* | 3/2023 | Ho | H10D 62/40 |
| 2023/0068619 | A1* | 3/2023 | Chang | H10D 30/6757 |
| 2023/0072305 | A1* | 3/2023 | Cheng | H10D 64/252 |
| 2023/0074880 | A1* | 3/2023 | Park | H01L 29/42392 |
| 2023/0079697 | A1* | 3/2023 | Lee | H10D 30/6735 257/351 |
| 2023/0123987 | A1* | 4/2023 | Cheng | H01L 29/66545 257/288 |
| 2023/0138121 | A1* | 5/2023 | Park | H01L 29/78696 257/351 |
| 2023/0261079 | A1* | 8/2023 | Song | H01L 29/78696 257/288 |
| 2023/0402463 | A1* | 12/2023 | Choi | H10D 84/038 |

FOREIGN PATENT DOCUMENTS

| | | |
|---|---|---|
| KR | 10-2004-0041327 A | 5/2004 |
| KR | 10-0541817 | 1/2006 |
| KR | 10-2006-0068038 | 6/2006 |
| KR | 10-0667904 | 1/2007 |
| KR | 10-1147372 | 5/2012 |
| KR | 10-2015-0019903 A | 2/2015 |
| KR | 10-2017-0045616 A | 4/2017 |
| TW | 201926684 | 7/2019 |
| TW | 201931474 | 8/2019 |

OTHER PUBLICATIONS

Office Action in Korean Appln. No. 10-2020-0042140, mailed on Dec. 17, 2024, 15 pages (with English translation).

* cited by examiner

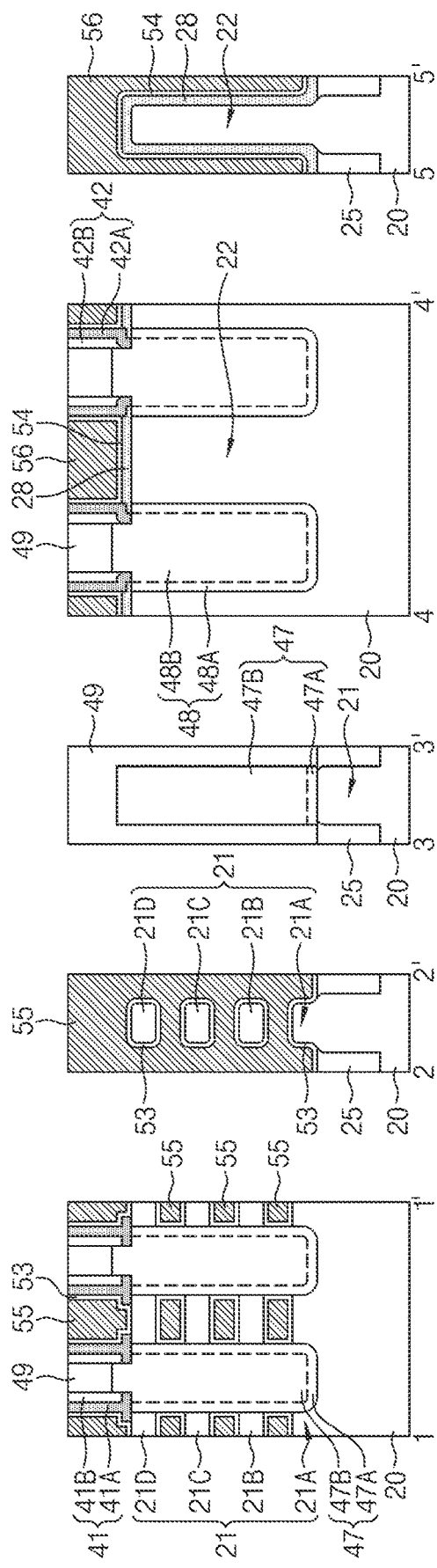
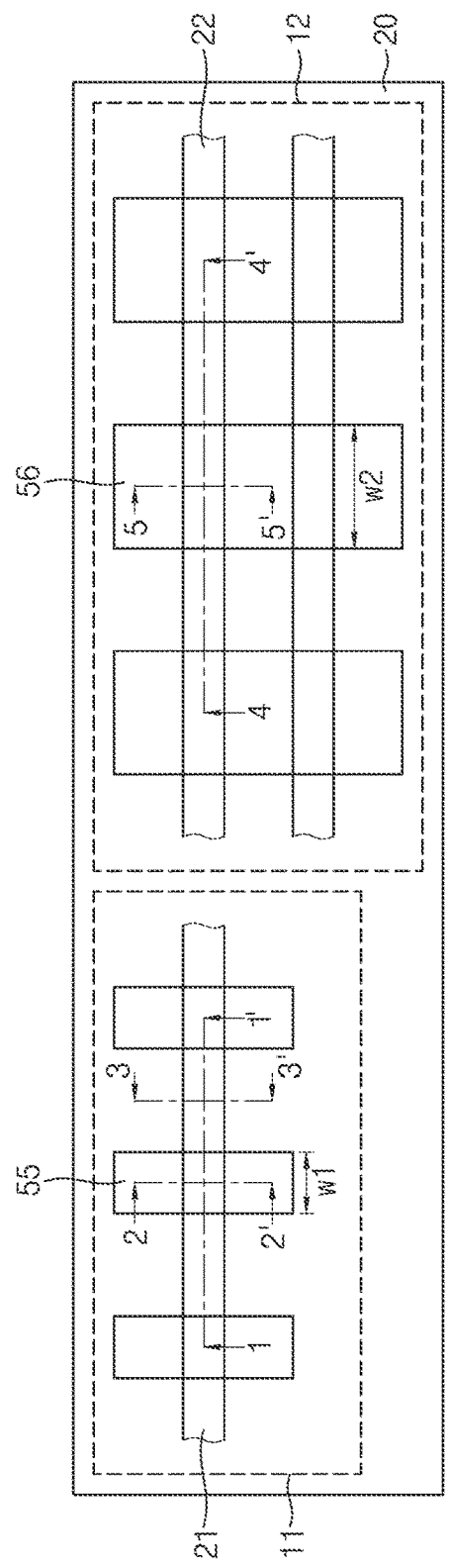
FIG. 1
FIG. 2

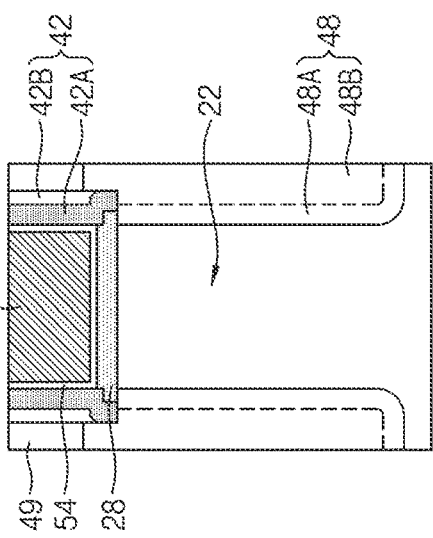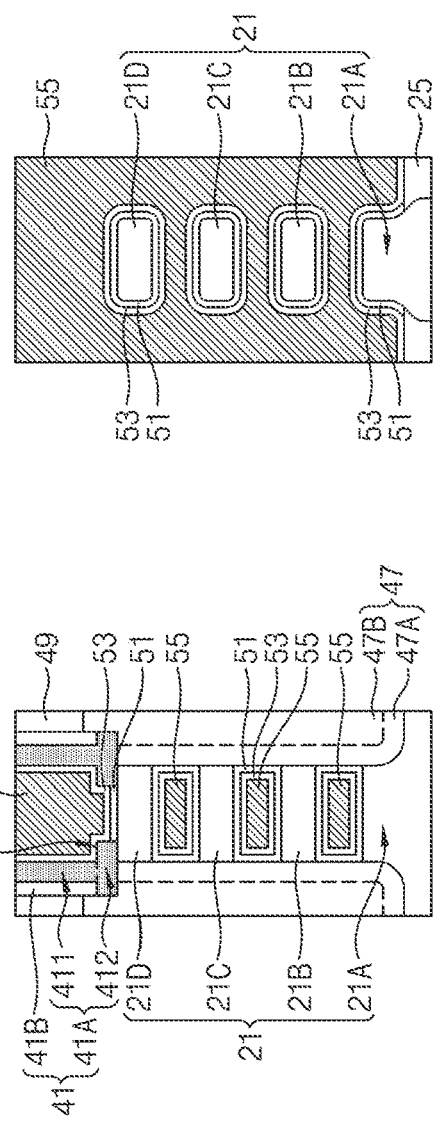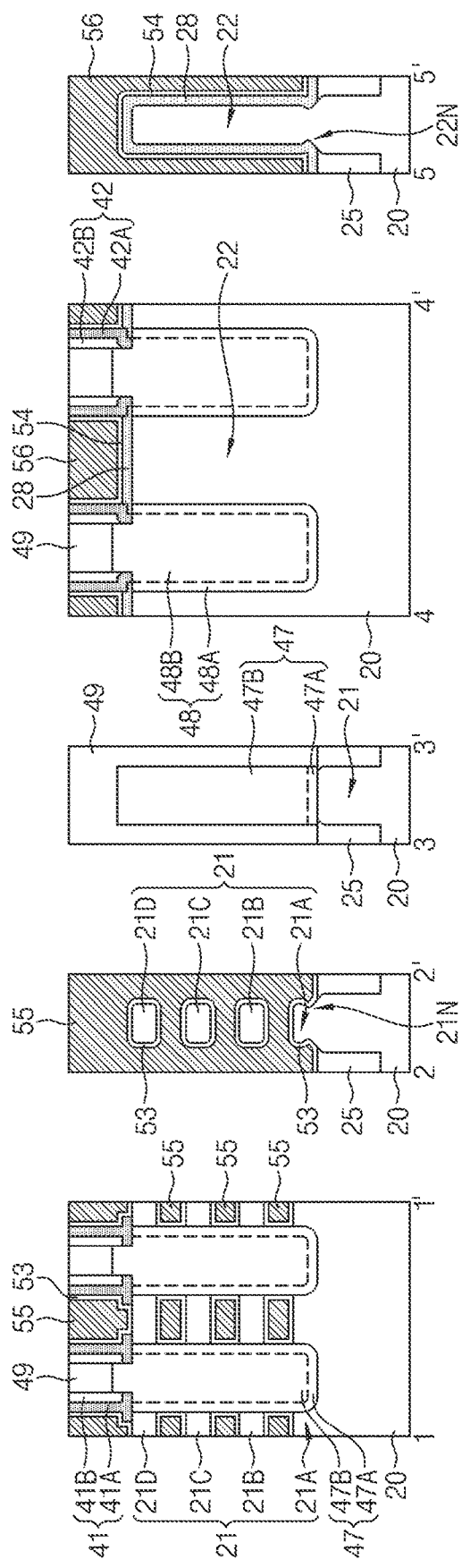

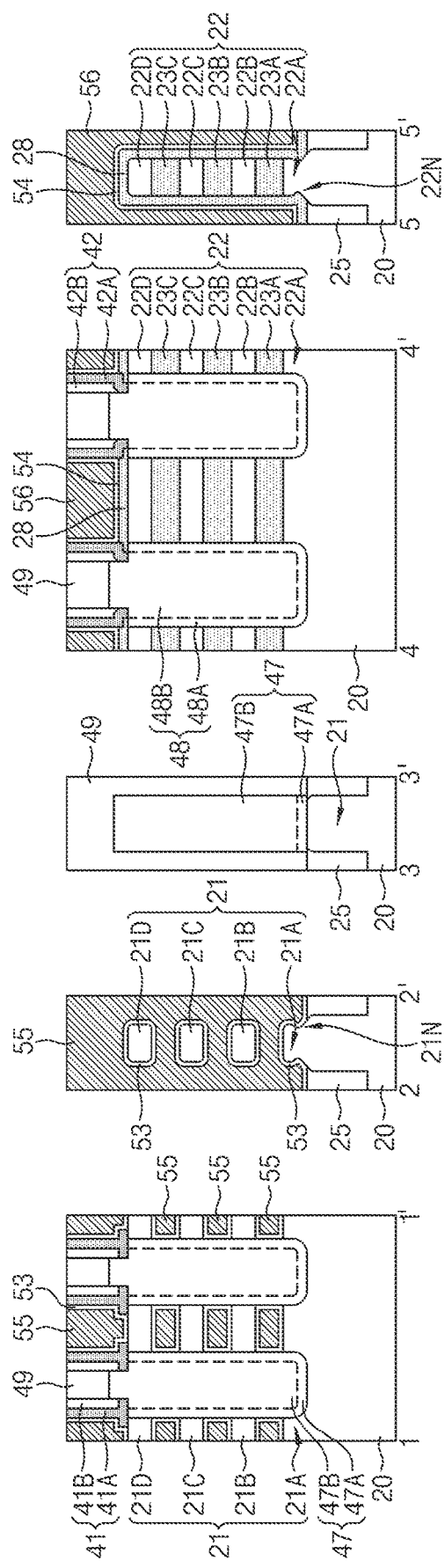
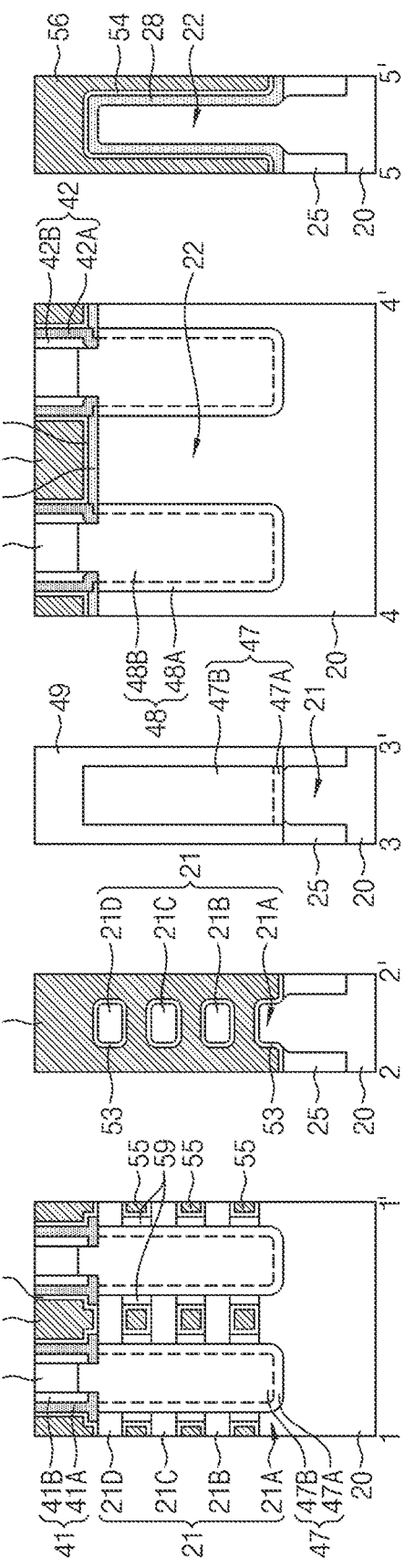
FIG. 7
FIG. 8

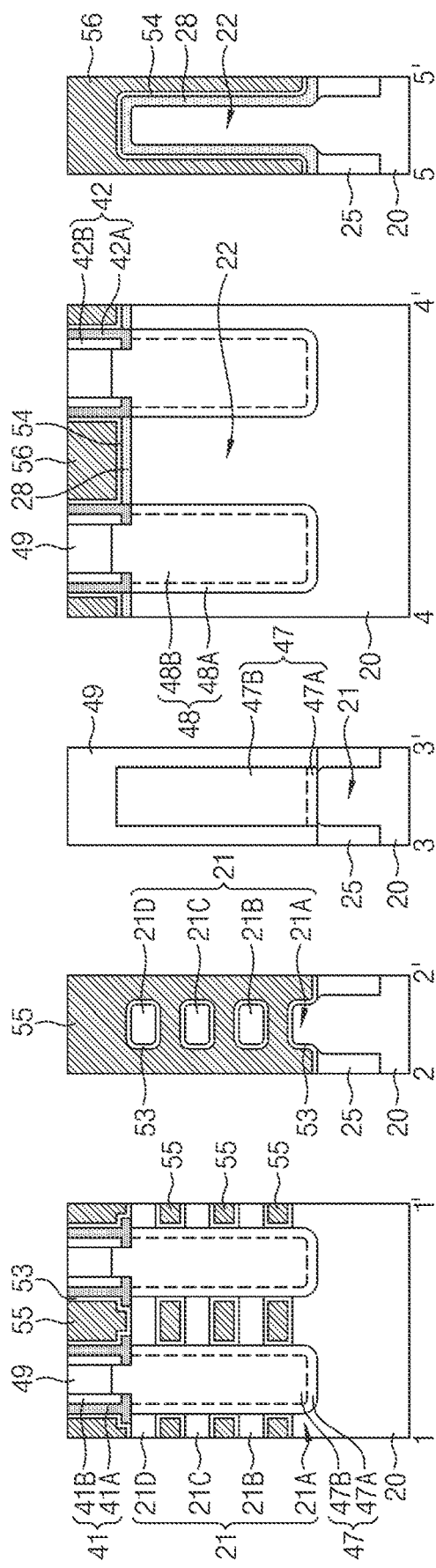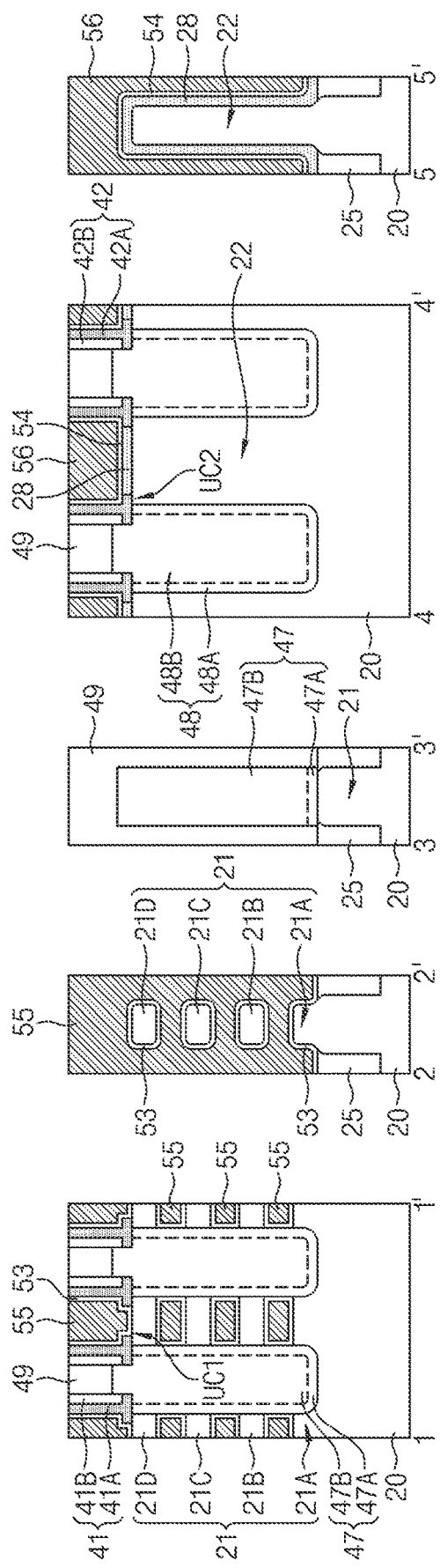

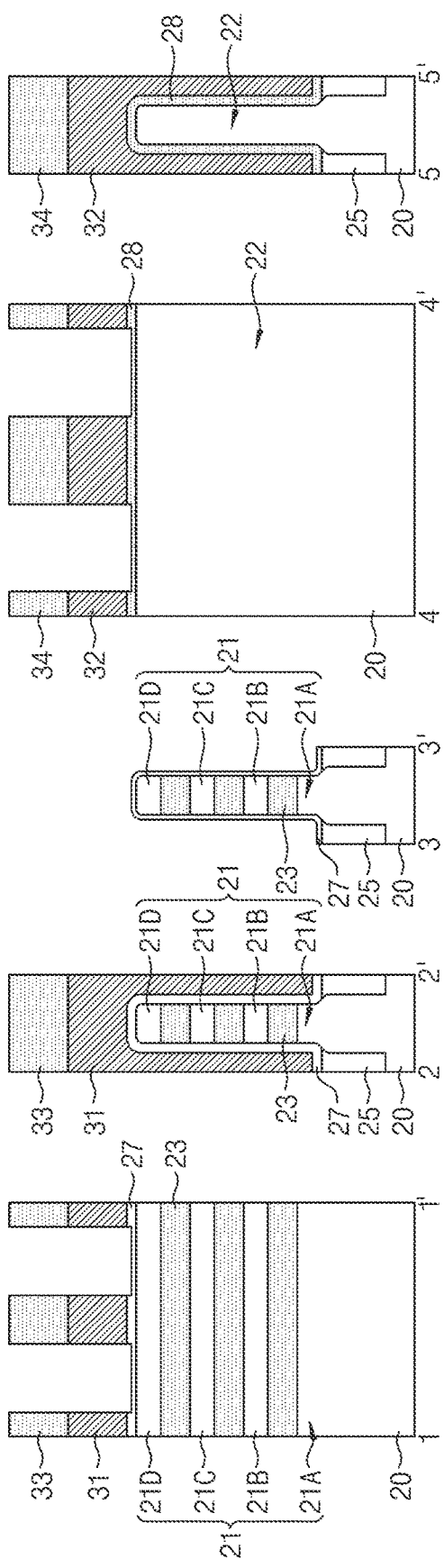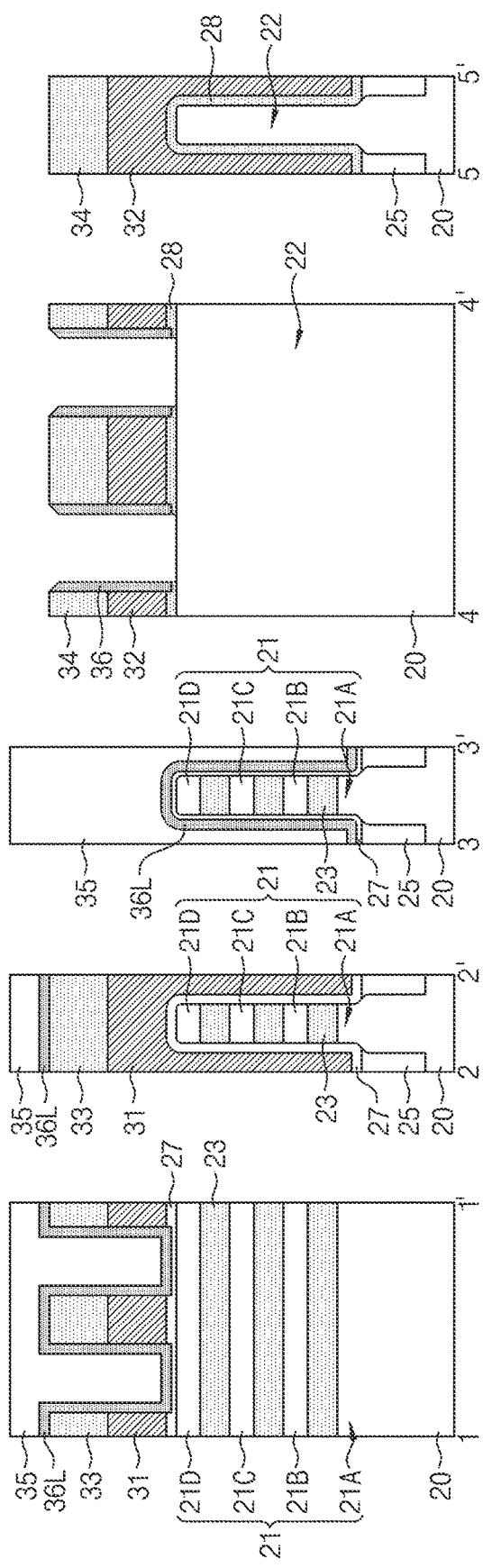

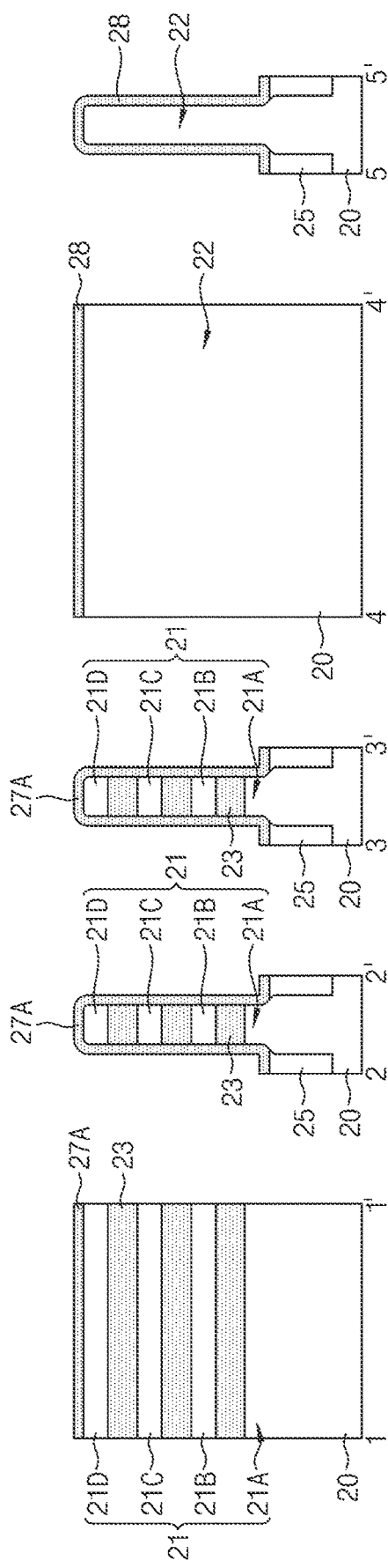
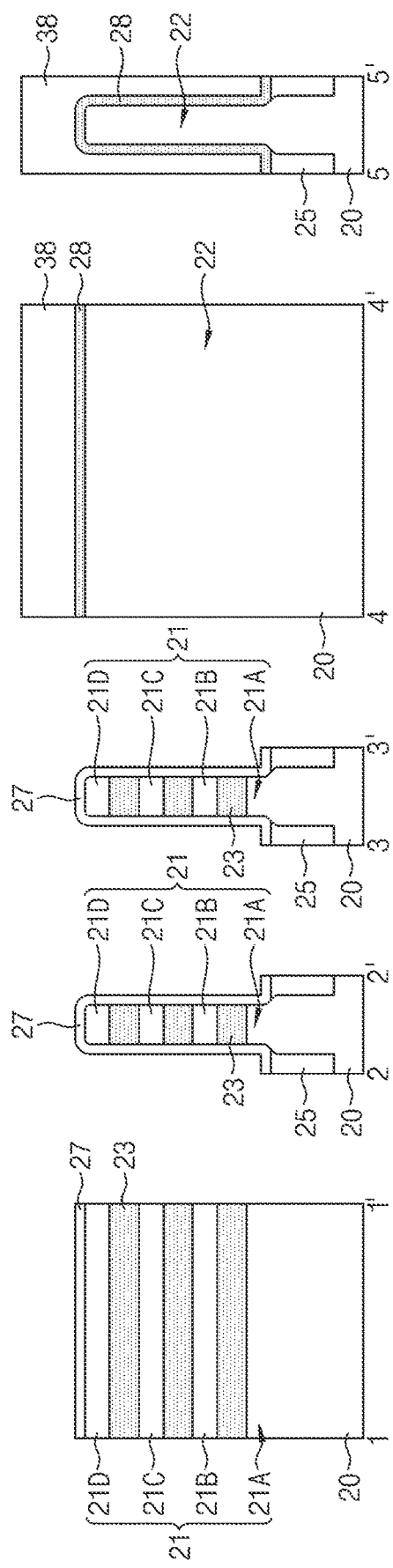

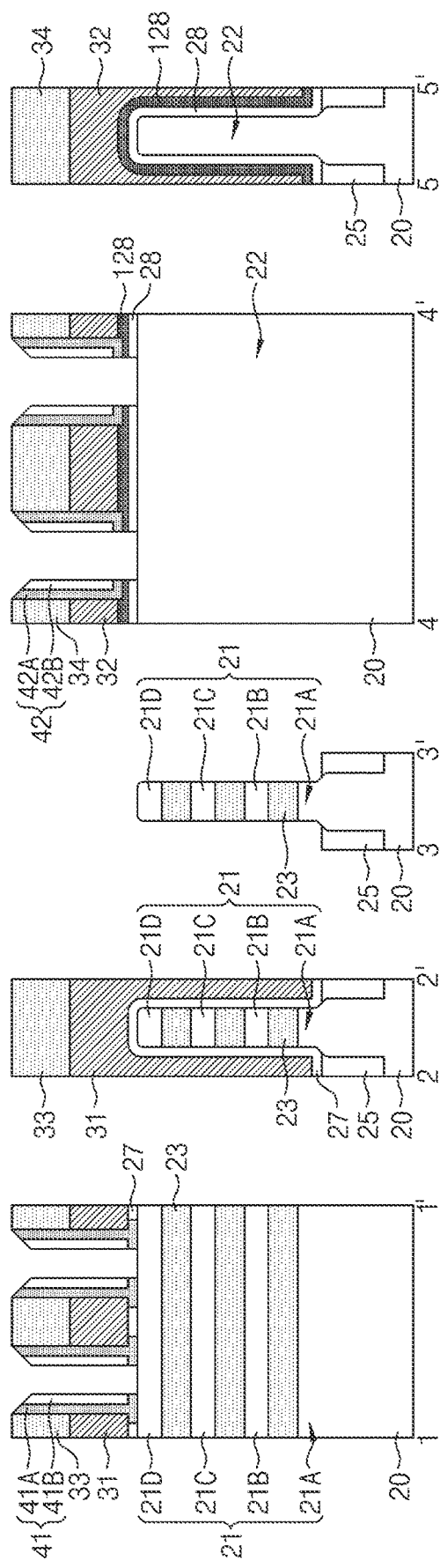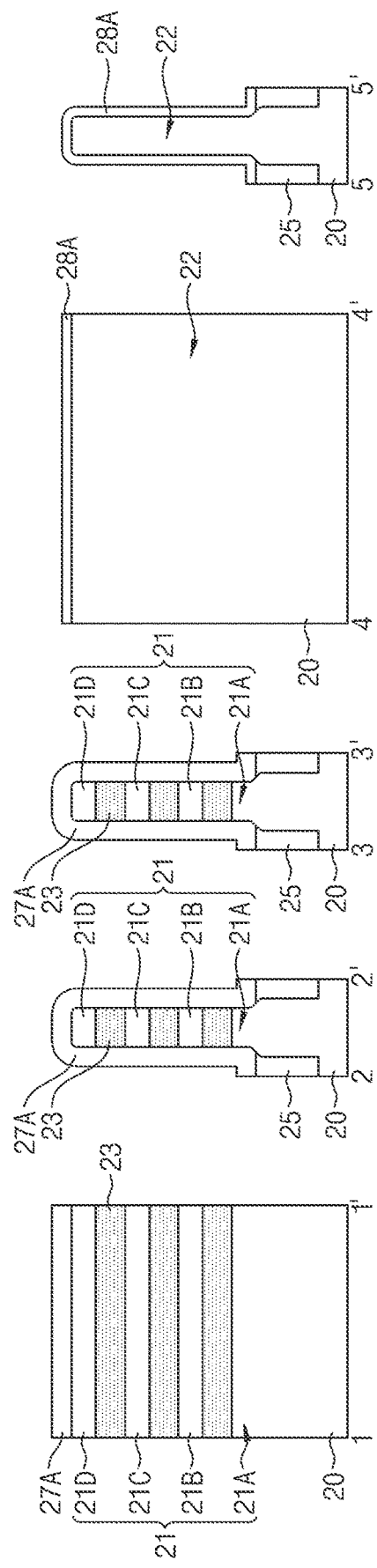

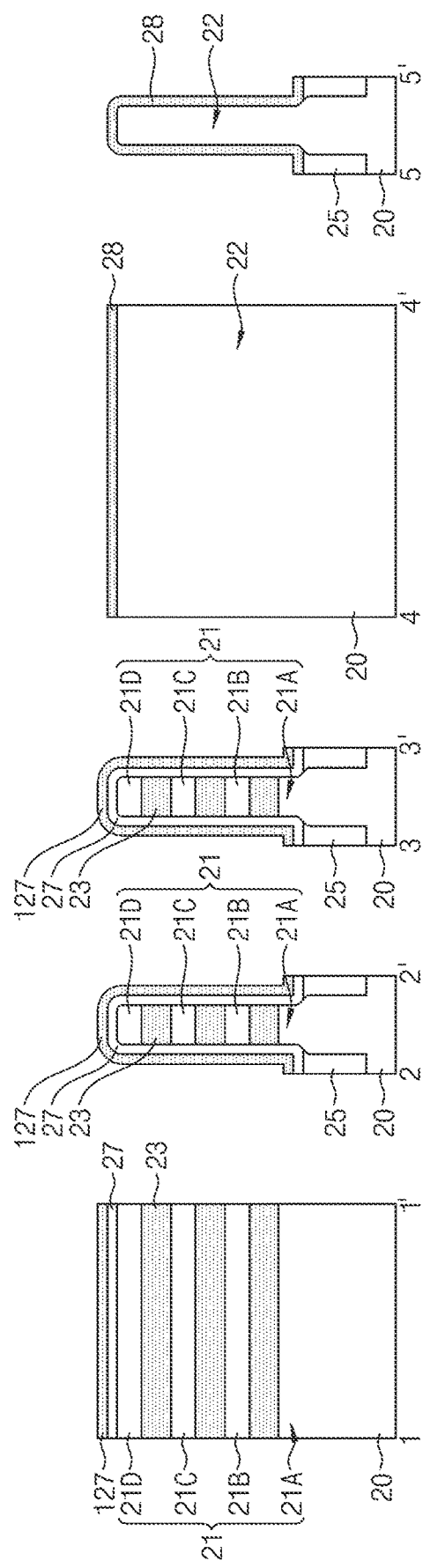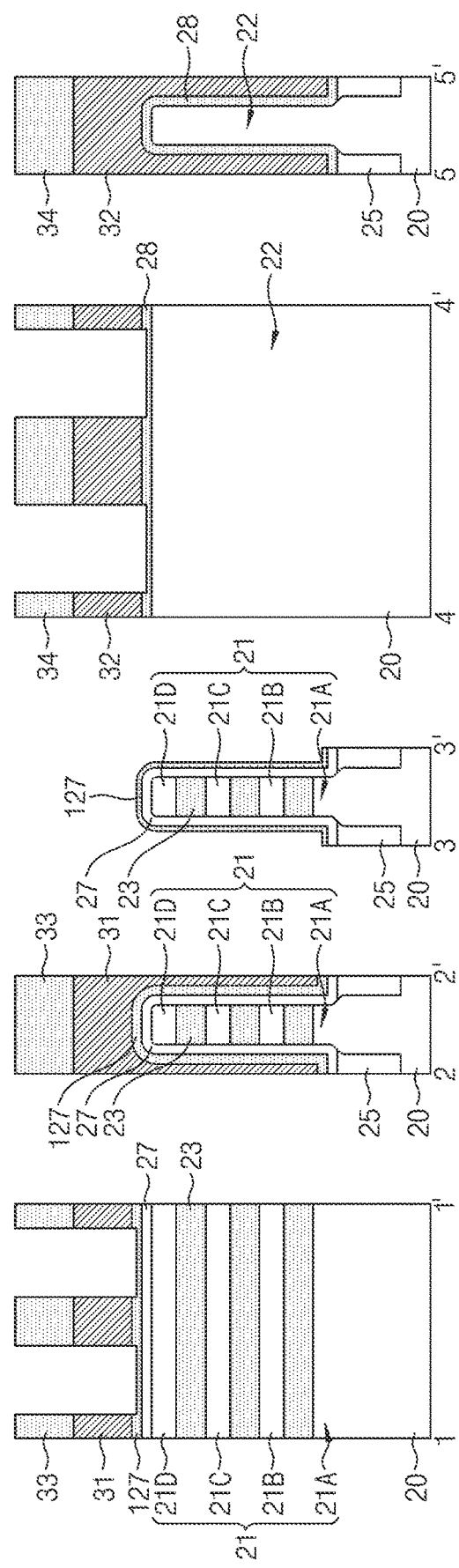

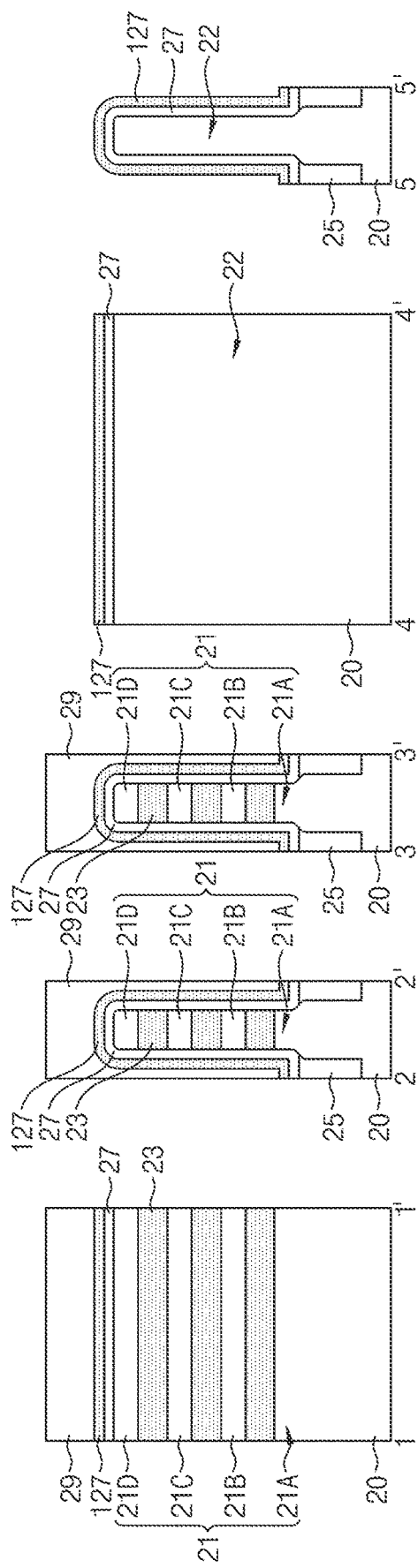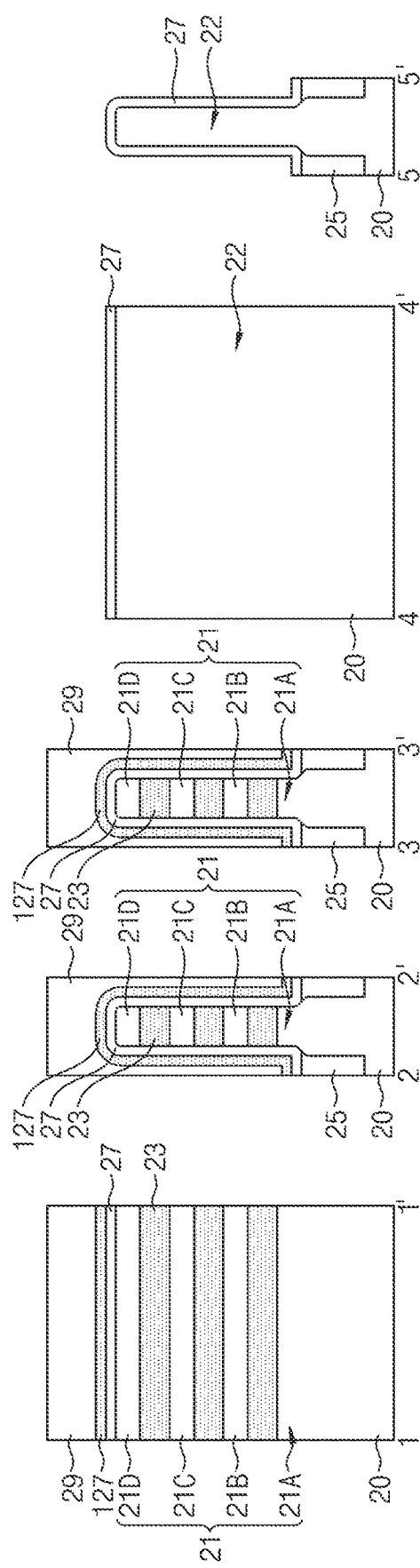

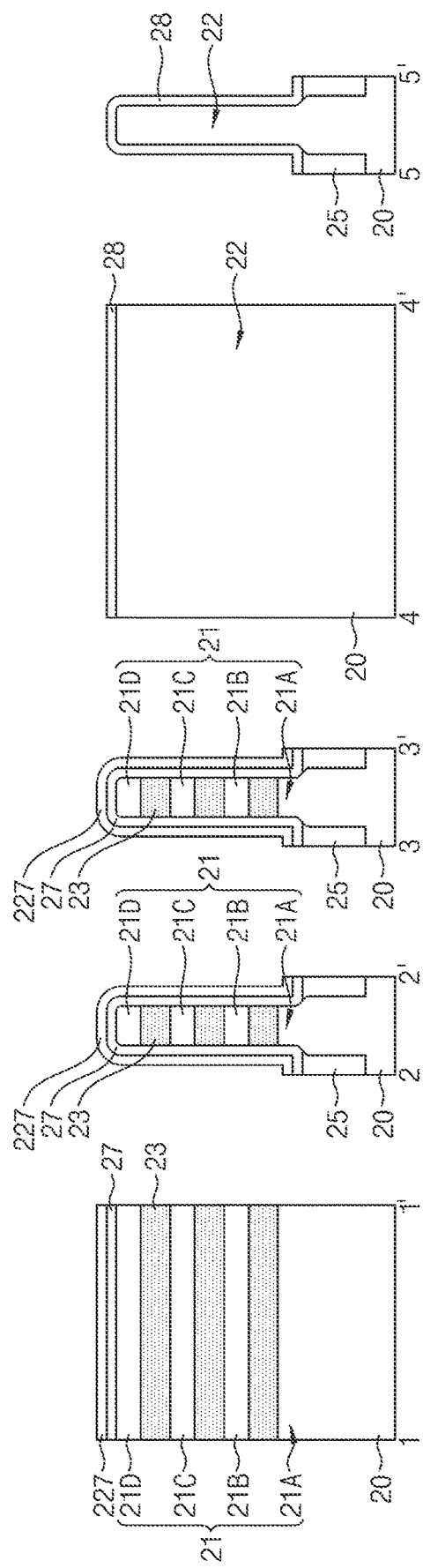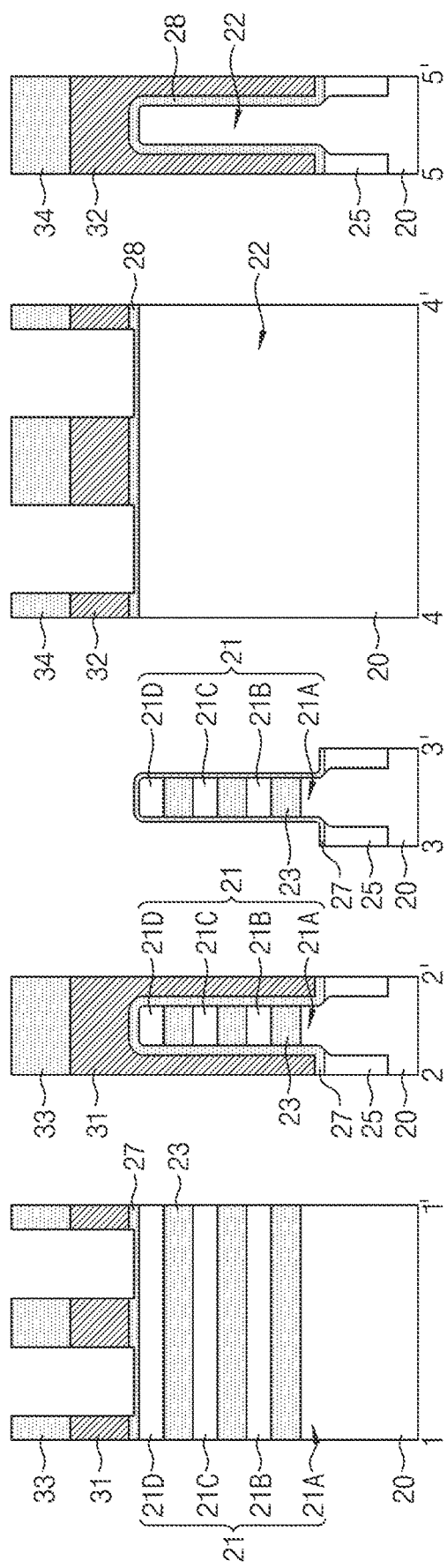

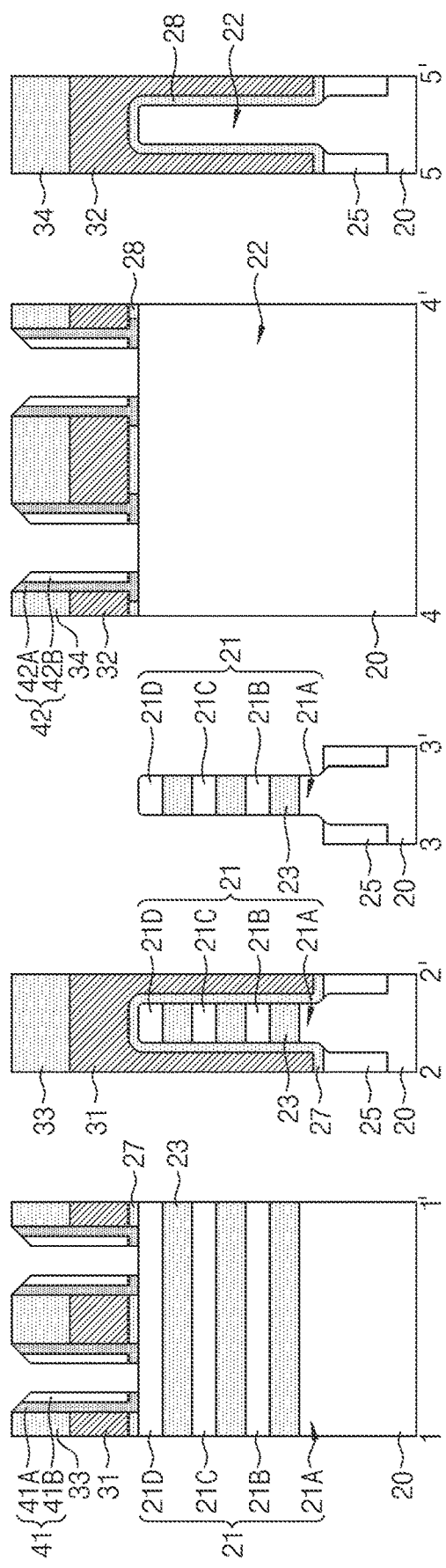

ative region defined on a substrate. A first gate electrode may be disposed across the first active region thereon. A first drain region may be disposed in the first active region at a position adjacent to the first gate electrode. An undercut region may be disposed between the first active region and the first gate electrode. A first gate spacer may be disposed on a side surface of the first gate electrode, and may extend in the undercut region.

A semiconductor device in accordance with an exemplary embodiment of the disclosure may include a first active region defined in a first region on a substrate. A first gate electrode may be disposed across the first active region thereon. A first drain region may be disposed in the first active region at a position adjacent to the first gate electrode. A first gate spacer may be disposed on a side surface of the first gate electrode. A second active region may be defined in a second region on the substrate. A second gate electrode may be disposed across the second active region thereon, and may have a different horizontal width from the first gate electrode. A second drain region may be disposed in the second active region at a position adjacent to the second gate electrode. A lower gate dielectric layer may be disposed between the second active region and the second gate electrode, and may have a smaller width than the second gate electrode. A second gate spacer may be disposed on a side surface of the second gate electrode, and may extend in an undercut region between the second active region and the second gate electrode. The second gate spacer may be in contact with a side surface of the lower gate dielectric layer.

A semiconductor device in accordance with an exemplary embodiment of the disclosure may include a first active region defined in a first region on a substrate. A first gate electrode may be disposed across the first active region thereon. A first gate dielectric layer may be disposed between the first active region and the first gate electrode. A pair of first drain regions may be disposed in the first active region at positions adjacent to opposite sides of the first gate electrodes, and may be spaced apart from each other. An undercut region may be disposed between the first active region and the first gate electrode. A first gate spacer may be disposed on a side surface of the first gate electrode, and may extend in the undercut region. A second active region may be defined in the second region on the substrate. A second gate electrode may be disposed across the second active region thereon, and may have a larger horizontal width than the first gate electrode. A second gate dielectric layer may be disposed between the second active region and the second gate electrode. A pair of second drain regions may be disposed in the second active region at positions adjacent to opposite sides of the second gate electrodes, and may be spaced apart from each other. A lower gate dielectric layer may be disposed between the second active region and the second gate dielectric layer, and may have a larger horizontal width than the second gate electrode. A second gate spacer may be disposed on a side surface of the second gate electrode. The first active region may include a plurality of channel regions. Each of the plurality of channel regions may be in contact with the pair of first drain regions. The first gate electrode may surround a top surface, a side surface, and a bottom surface of at least one of the plurality of channel regions. The second gate electrode may be disposed on a top surface and a side surface of the second active region. The lower end of the second gate electrode may be disposed at a lower level than the upper end of the second active region.

A method of forming a semiconductor device in accordance with an exemplary embodiment of the disclosure may include defining a first active region and a second active region on a substrate. A first gate electrode may be formed across the first active region thereon, and a second gate electrode may be formed across the second active region thereon. A first drain region may be formed in the first active region at a position adjacent to the first gate electrode, and a second drain region may be formed in the second active region at a position adjacent to the second gate electrode. A first gate spacer may be formed on a side surface of the first gate electrode. A lower gate dielectric layer may be formed between the second active region and the second gate electrode. A second gate spacer may be formed on a side surface of the second gate electrode. The first gate spacer may extend in an undercut region between the first active region and the first gate electrode.

BRIEF DESCRIPTION OF THE DRAWINGS

Features will become apparent to those of skill in the art by describing in detail exemplary embodiments with reference to the attached drawings, in which:

FIG. 1 is a cross-sectional view illustrating semiconductor devices according to exemplary embodiments of the disclosure.

FIG. 2 is a layout illustrating semiconductor devices according to exemplary embodiments of the disclosure.

FIGS. 3 to 5 are enlarged views of parts shown in FIG. 1.

FIGS. 6 to 13 are cross-sectional views illustrating semiconductor devices according to exemplary embodiments of the disclosure.

FIGS. 14 to 57 are cross-sectional views of stages in methods of forming semiconductor devices according to exemplary embodiments of the disclosure.

DETAILED DESCRIPTION

Figure 9:
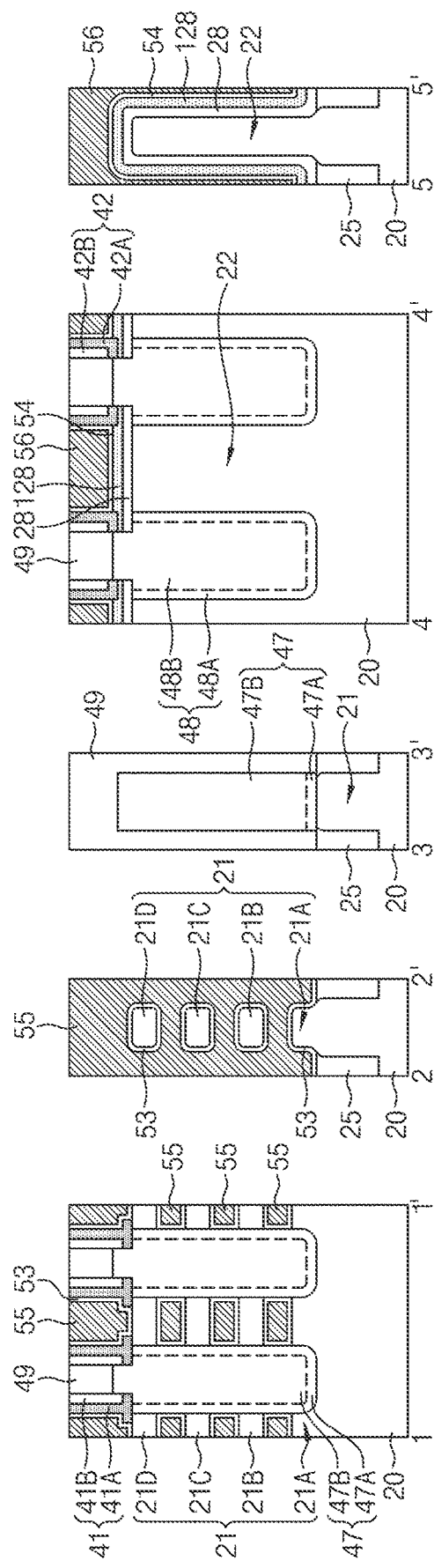

FIG. 1 is a cross-sectional view illustrating semiconductor devices according to exemplary embodiments of the disclosure, and FIG. 2 is a layout illustrating semiconductor devices according to exemplary embodiments of the disclosure. FIGS. 3 to 5 are enlarged views of parts shown in FIG. 1. FIG. 1 illustrates cross-sectional views taken along lines 1-1', 2-2', 3-3', 4-4' and 5-5' in FIG. 2. Semiconductor devices according to exemplary embodiments of the disclosure may include MBCFET®, finFET, or a combination thereof.

Referring to FIG. 1, semiconductor devices according to exemplary embodiments of the disclosure may include a substrate 20, a first active region 21, a second active region 22, a device isolation layer 25, a lower gate dielectric layer 28, a first gate spacer 41, a second gate spacer 42, a plurality of first drain regions 47, a plurality of second drain regions 48, an interlayer insulating layer 49, a first gate dielectric layer 53, a second gate dielectric layer 54, a plurality of first gate electrodes 55, and a plurality of second gate electrodes 56.

The first active region 21 may include a plurality of channel regions 21A, 21B, 21C and 21D. The plurality of channel regions 21A, 21B, 21C and 21D may include a first channel region 21A, a second channel region 21B, a third channel region 21C, and a fourth channel region 21D. The first gate spacer 41 may include a first inner spacer 41A and a first outer spacer 41B. The second gate spacer 42 may include a second inner spacer 42A and a second outer spacer 42B. Each of the plurality of first drain regions 47 may include a first layer 47A and a second layer 47B. Each of the plurality of second drain regions 48 may include a third layer 48A and a fourth layer 48B.

Referring to FIG. 2, the substrate 20 may be provided to have a first region 11 and a second region 12 that is adjacent to the first region 11. The first active region 21 may be disposed in the first region 11 on the substrate 20. The second active region 22 may be disposed in the second region 12 on the substrate 20. The plurality of first gate electrodes 55 may be disposed across the first active region 21 in the first region 11. The plurality of second gate electrodes 56 may be disposed across the second active region 22 in the second region 12.

Each of the plurality of second gate electrodes 56 may have a different horizontal width from each of the plurality of first gate electrodes 55. Each of the plurality of second gate electrodes 56 may have a larger horizontal width than each of the plurality of first gate electrodes 55. Each of the plurality of first gate electrodes 55 may have a first width W1. Each of the plurality of second gate electrodes 56 may have a second width W2. The second width W2 may be larger than the first width W1.

Referring to FIG. 3, which illustrates an enlarged portion of FIG. 1 along line 1-1', the first gate dielectric layer 53 may be disposed between the first gate electrode 55 and the plurality of channel regions 21A, 21B, 21C and 21D. The first gate dielectric layer 53 may extend between the first gate electrode 55 and the first gate spacer 41. An interfacial dielectric layer 51 may be disposed between the first gate dielectric layer 53 and the plurality of channel regions 21A, 21B, 21C and 21D. The interfacial dielectric layer 51 may include silicon oxide formed through a thermal oxidation process or a cleaning process. The interfacial dielectric layer 51 may be omitted. In an exemplary embodiment, the first gate dielectric layer 53 may be interposed between the first gate electrode 55 and the interfacial dielectric layer 51.

A pair of first drain regions 47 may be disposed in the first active region 21 at positions adjacent to opposite sides of the first gate electrode 55. The pair of first drain regions 47 may be spaced apart from each other. Each of the plurality of channel regions 21A, 21B, 21C and 21D may be in contact with the pair of first drain regions 47.

A first undercut region UC1 may be disposed between the first active region 21 and the first gate electrode 55. For example, as illustrated in FIG. 3, a bottom of the first gate electrode 55 may have a stair profile at bottom corners thereof, e.g., a center portion of the bottom of the first gate electrode 55 may extend deeper than edge portions of the bottom of the first gate electrode 55 to define the stair profile, such that the undercut region UC1 may be defined under the edge portions of the bottom of the first gate electrode 55.

The first gate spacer 41 may include the first inner spacer 41A and the first outer spacer 41B. The first inner spacer 41A may include an upper portion 411, which is disposed on the side surface of the first gate electrode 55, and a lower portion 412, which extends, e.g., continuously, from the lower end of the first upper portion 411 into the first undercut region UC1. The lower portion 412 may extend between the first active region 21 and the first gate electrode 55, e.g., between the first active region 21 and the edge portion of the bottom of the first gate electrode 55. A straight line, e.g., an imaginary straight line, that extends along the outermost side surface of the first gate electrode 55 and is perpendicular to the surface of the substrate 20 may intersect the lower portion 412. The upper portion 411 may have a height greater than the horizontal width thereof. The lower portion 412 may have a horizontal width greater than the height thereof, e.g., the upper and lower portions 411 and 412 may have a combined cross-section of an inverted "T" that extends along the outermost side surface of the first gate electrode 55 and protrudes into the first undercut region UC1 to partially overlap the edge portion of the bottom of the first gate electrode 55.

The first gate dielectric layer 53 may be interposed between the first gate electrode 55 and the upper portion 411 and between the first gate electrode 55 and the lower portion 412. The first gate dielectric layer 53 may be in contact with the side and top surfaces of the lower portion 412. The first gate dielectric layer 53 may be in contact with the side surface of the upper portion 411, e.g., the first gate dielectric layer 53 may be conformal on outer surfaces of the first gate electrode 55.

Referring to FIG. 4, which illustrates an enlarged portion of FIG. 1 along line 2-2', the interfacial dielectric layer 51 may cover the top and side surfaces of the first channel region 21A. The interfacial dielectric layer 51 may surround the top, bottom and side surfaces of the second channel region 21B, the third channel region 21C, and the fourth channel region 21D. The first gate electrode 55 may surround the top, bottom and side surfaces of the second channel region 21B, the third channel region 21C, and the fourth channel region 21D. The first gate electrode 55 may cover the top and side surfaces of the first channel region 21A. The first gate dielectric layer 53 may be disposed between the first gate electrode 55 and the interfacial dielectric layer 51. The interfacial dielectric layer 51 may be omitted.

Referring to FIG. 5, which illustrates an enlarged portion of FIG. 1 along line 4-4', a pair of second drain regions 48 may be disposed in the second active region 22 at positions adjacent to the second gate electrode 56. The pair of second drain regions 48 may be spaced apart from each other. The second gate dielectric layer 54 may be disposed between the second gate electrode 56 and the second active region 22. The lower gate dielectric layer 28 may be disposed between the second gate dielectric layer 54 and the second active region 22. The second gate spacer 42 may be disposed on the side surface of the second gate electrode 56. The second gate dielectric layer 54 may extend between the second gate electrode 56 and the second gate spacer 42.

The lower gate dielectric layer 28 may have a larger horizontal width than the second gate electrode 56. The lower gate dielectric layer 28 may protrude, e.g., along the horizontal direction, beyond the second gate electrode 56. The second gate spacer 42 may be in contact with the top and side surfaces of the lower gate dielectric layer 28. The second gate spacer 42 may include the second inner spacer 42A and the second outer spacer 42B. The second inner spacer 42A may be in contact with the top and side surfaces of the lower gate dielectric layer 28. In an exemplary embodiment, the second gate dielectric layer 54 may be disposed on the lower gate dielectric layer 28.

Referring again to FIGS. 1 to 5, the first active region 21 and the second active region 22 may be defined on the substrate 20. The first gate electrode 55 may be disposed across the first active region 21. The first drain region 47 may be disposed in the first active region 21 at a position adjacent to the first gate electrode 55. The first undercut region UC1 may be disposed between the first active region 21 and the first gate electrode 55. The first gate spacer 41 may be disposed on the side surface of the first gate electrode 55, and may extend into the first undercut region UC1. The first gate spacer 41 may have, e.g., an inverted T shape or an L shape.

The second gate electrode 56 may be disposed across the second active region 22. The second drain region 48 may be disposed in the second active region 22 at a position adjacent to the second gate electrode 56. The lower gate dielectric layer 28 may be disposed between the second active region 22 and the second gate electrode 56. The second gate spacer 42 may be disposed on the side surface of the second gate electrode 56. The second gate electrode 56 may be disposed on the top and side surfaces of the second active region 22. The lower end of the second gate electrode 56 may be disposed at a lower level than the upper end of the second active region 22. The second gate electrode 56 may have a larger horizontal width than the first gate electrode 55. In an exemplary embodiment, the lower portion 412 of the first inner spacer 41A may have substantially the same thickness, e.g., along a vertical direction, as the lower gate dielectric layer 28.

FIGS. 6 to 13 are cross-sectional views illustrating semiconductor devices according to exemplary embodiments of the disclosure. FIGS. 6 to 13 are cross-sectional views taken along lines 1-1', 2-2', 3-3', 4-4' and 5-5' in FIG. 2.

Referring to FIG. 6, the first active region 21 may include a first notch 21N, which is disposed adjacent to the top surface of the device isolation layer 25. The second active region 22 may include a second notch 22N, which is disposed adjacent to the top surface of the device isolation layer 25.

Referring to FIG. 7, the second active region 22 may include a plurality of semiconductor layers 22A, 23A, 22B, 23B, 22C, 23C and 22D. The plurality of semiconductor layers 22A, 23A, 22B, 23B, 22C, 23C and 22D may include a first semiconductor layer 22A, a second semiconductor layer 23A, a third semiconductor layer 22B, a fourth semiconductor layer 23B, a fifth semiconductor layer 22C, a sixth semiconductor layer 23C, and a seventh semiconductor layer 22D, which are sequentially stacked. The first semiconductor layer 22A may be defined in the second active region 22. The first semiconductor layer 22A may include a semiconductor layer such as a single-crystal silicon layer.

Each of the second semiconductor layer 23A, the third semiconductor layer 22B, the fourth semiconductor layer 23B, the fifth semiconductor layer 22C, the sixth semiconductor layer 23C, and the seventh semiconductor layer 22D may include a single-crystal semiconductor layer that is formed through an epitaxial growth method. In an exemplary embodiment, each of the third semiconductor layer 22B, the fifth semiconductor layer 22C, and the seventh semiconductor layer 22D may include a single-crystal silicon layer. Each of the second semiconductor layer 23A, the fourth semiconductor layer 23B, and the sixth semiconductor layer 23C may include a single-crystal SiGe layer.

Referring to FIG. 8, a plurality of blocking patterns 59 may be disposed between the plurality of first drain regions 47 and the plurality of first gate electrodes 55. The plurality of blocking patterns 59 may include, e.g., silicon oxide, silicon nitride, silicon oxynitride, or combinations thereof. In an exemplary embodiment, the plurality of blocking patterns 59 may include silicon nitride. The plurality of blocking patterns 59 may be disposed between the plurality of channel regions 21A, 21B, 21C and 21D. The plurality of blocking patterns 59 may be interposed between the first layer 47A and the first gate dielectric layer 53.

Referring to FIG. 9, an intermediate gate dielectric layer 128 may be disposed on the lower gate dielectric layer 28. The second gate dielectric layer 54 may be disposed on the intermediate gate dielectric layer 128. The intermediate gate dielectric layer 128 may include a material having etch selectivity with respect to the lower gate dielectric layer 28. The intermediate gate dielectric layer 128 may include a different material from the lower gate dielectric layer 28. The intermediate gate dielectric layer 128 may have a larger horizontal width than the second gate electrode 56. The intermediate gate dielectric layer 128 may protrude beyond the second gate electrode 56. The second inner spacer 42A may be in contact with the top surface of the intermediate gate dielectric layer 128.

Figure 10:
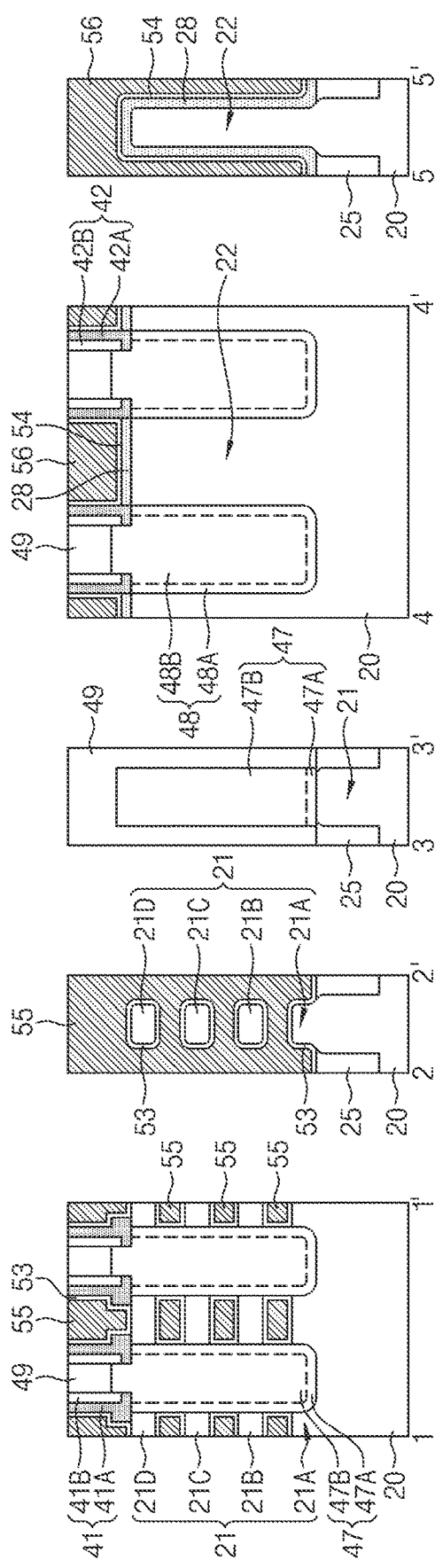

Referring to FIG. 10, the first gate spacer 41 may have various thicknesses and shapes. In an exemplary embodiment, the portion of the first gate spacer 41 that is located between the first gate electrode 55 and the first active region 21 may be thicker than the lower gate dielectric layer 28. The outermost portion of the lower gate dielectric layer 28 may be aligned between the second gate spacer 42 and the second gate electrode 56.

Referring to FIG. 11, the portion of the first gate spacer 41 that is located between the first gate electrode 55 and the first active region 21 may have substantially the same thickness as the lower gate dielectric layer 28. The outermost portion of the lower gate dielectric layer 28 may be aligned between the second gate spacer 42 and the second gate electrode 56.

Referring to FIG. 12, the lower gate dielectric layer 28 may have a smaller horizontal width than the second gate electrode 56. The second gate spacer 42 may extend in a second undercut region UC2 between the second active region 22 and the second gate electrode 56. The second gate spacer 42 may have an L shape. In an exemplary embodiment, the second inner spacer 42A may extend in the second undercut region UC2. The second inner spacer 42A may have an L shape. The second inner spacer 42A may be in contact with the side surface of the lower gate dielectric layer 28.

Figure 13:
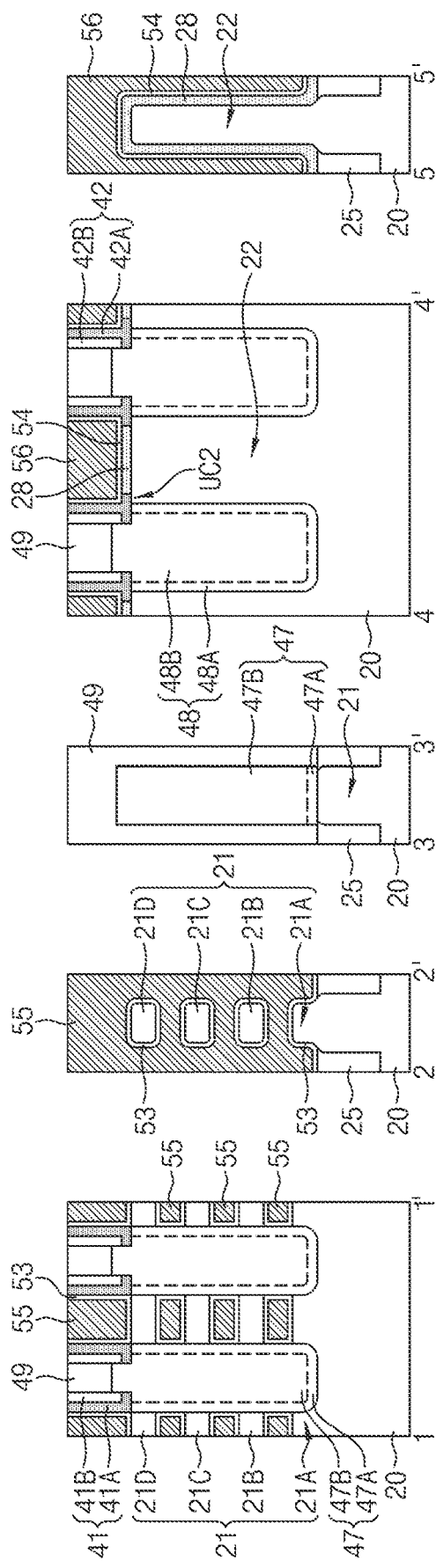

Referring to FIG. 13, the first gate spacer 41 may be disposed on the side surface of the first gate electrode 55. The first gate dielectric layer 53 may be disposed between the first gate electrode 55 and the first active region 21 and between the first gate electrode 55 and the first gate spacer 41. The first undercut region (UC1 in FIG. 3) may be omitted.

The lower gate dielectric layer 28 may have a smaller horizontal width than the second gate electrode 56. The second gate spacer 42 may extend in the second undercut region UC2 between the second active region 22 and the second gate electrode 56. The second gate spacer 42 may have an L shape. The second gate spacer 42 may be in contact with the side surface of the lower gate dielectric layer 28.

FIGS. 14 to 27 are cross-sectional views of stages in methods of forming semiconductor devices according to exemplary embodiments of the disclosure. FIGS. 14 to 27 are cross-sectional views along lines 1-1', 2-2', 3-3', 4-4' and 5-5' in FIG. 2.

Figure 14:
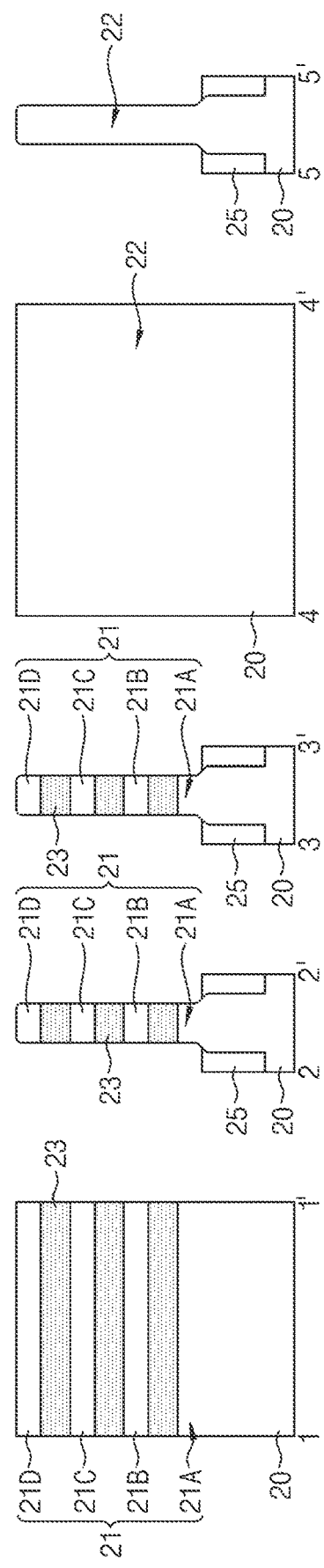

Referring to FIGS. 2 and 14, a device isolation layer 25 may be formed on the substrate 20 to define the first active region 21 and the second active region 22. The first active region 21 may be formed in the first region 11 on the substrate 20. The second active region 22 may be formed in the second region 12 on the substrate 20. The first active region 21 may include the plurality of channel regions 21A, 21B, 21C and 21D. A plurality of sacrificial layers 23 may be formed between the plurality of channel regions 21A, 21B, 21C and 21D. The plurality of channel regions 21A, 21B, 21C and 21D and the plurality of sacrificial layers 23 may be stacked alternately and repeatedly. The plurality of channel regions 21A, 21B, 21C and 21D may include the first channel region 21A, the second channel region 21B, the third channel region 21C, and the fourth channel region 21D.

The substrate 20 may include a semiconductor substrate, e.g., a silicon wafer or a silicon-on-insulator (SOI) wafer. Each of the first active region 21 and the second active region 22 may have a height, e.g., along the vertical direction, greater than the horizontal width thereof. Formation of the plurality of channel regions 21A, 21B, 21C and 21D and the plurality of sacrificial layers 23 may include an epitaxial growth process. In an exemplary embodiment, the plurality of sacrificial layers 23 may include a SiGe layer, formed through an epitaxial growth method. Each of the second channel region 21B, the third channel region 21C, and the fourth channel region 21D may include a Si layer, formed through an epitaxial growth method. The first channel region 21A may be defined in the substrate 20. The first channel region 21A may include a single-crystal Si layer. The second active region 22 may be defined in the substrate 20. The second active region 22 may include a single-crystal Si layer.

The device isolation layer 25 may include, e.g., silicon oxide, silicon nitride, silicon oxynitride, low-k dielectrics, high-k dielectrics, or combinations thereof. The top surface of the device isolation layer 25 may be formed at a lower level than the top surfaces of the first active region 21 and the second active region 22. The upper ends of the first active region 21 and the second active region 22 may protrude to a higher level than the top surface of the device isolation layer 25. The upper corners of the first active region 21 and the second active region 22 may be formed to be rounded.

Figure 15:
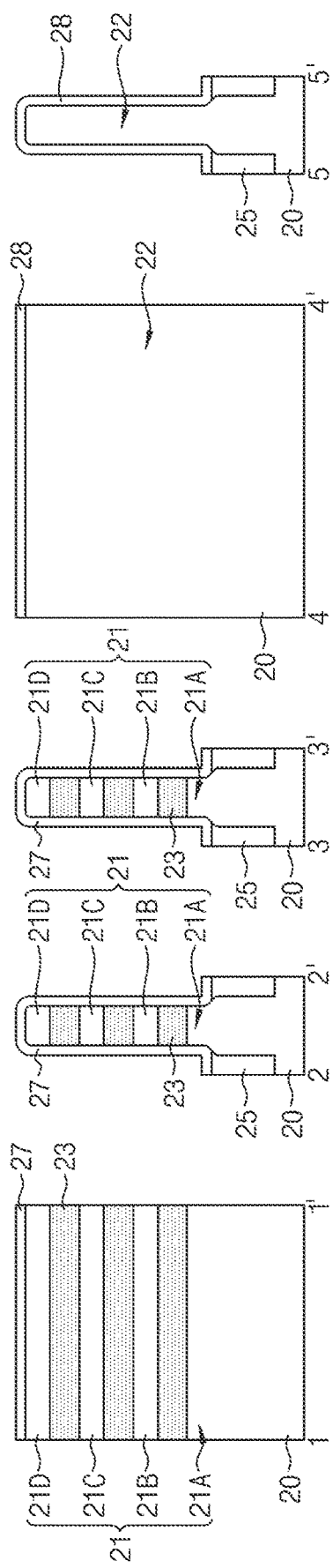

Referring to FIGS. 2 and 15, a buffer layer 27 and the lower gate dielectric layer 28 may be formed on the substrate 20. In an exemplary embodiment, the buffer layer 27 and the lower gate dielectric layer 28 may be formed simultaneously. The buffer layer 27 and the lower gate dielectric layer 28 may be substantially the same thickness. The buffer layer 27 and the lower gate dielectric layer 28 may include an insulating material, e.g., silicon oxide. The buffer layer 27 may cover the first active region 21. The lower gate dielectric layer 28 may cover the second active region 22.

Figure 16:
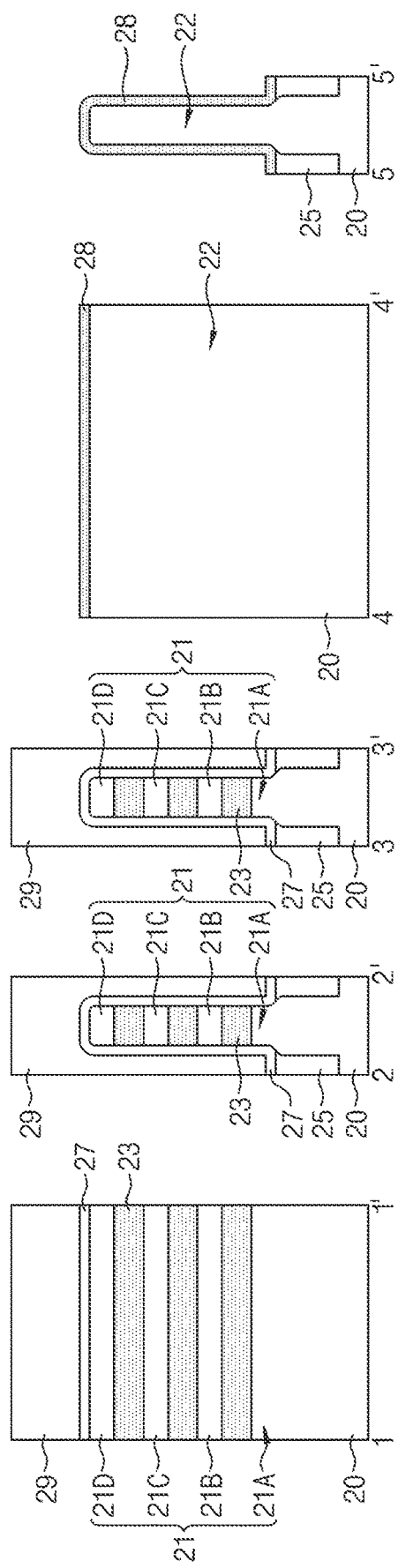

Referring to FIGS. 2 and 16, a first mask pattern 29 may be formed to cover the buffer layer 27 and expose the lower gate dielectric layer 28. Nitrogen may be injected into the lower gate dielectric layer 28. In an exemplary embodiment, the injecting nitrogen into the lower gate dielectric layer 28 may include a decoupled plasma nitridation (DPN) process, a post-nitridation annealing (PNA) process, or a combination thereof. The first mask pattern 29 may serve to prevent nitrogen from being injected into the buffer layer 27 during the process of injecting nitrogen into the lower gate dielectric layer 28.

Referring to FIGS. 2 and 17, the buffer layer 27 may be exposed by removing the first mask pattern 29. A plurality of first temporary gate electrodes 31 may be formed across the first active region 21 on the buffer layer 27. A second mask pattern 33 may be formed on the plurality of first temporary gate electrodes 31. A plurality of second temporary gate electrodes 32 may be formed across the second active region 22 on the lower gate dielectric layer 28. A third mask pattern 34 may be formed on the plurality of second temporary gate electrodes 32.

In an exemplary embodiment, the plurality of first temporary gate electrodes 31 and the plurality of second temporary gate electrodes 32 may include a polysilicon layer. The second mask pattern 33 and the third mask pattern 34 may include silicon nitride. Formation of the plurality of first temporary gate electrodes 31 and the plurality of second temporary gate electrodes 32 may include an anisotropic etching process using the second mask pattern 33 and the third mask pattern 34 as an etching mask. The buffer layer 27 between the plurality of first temporary gate electrodes 31 may be partially etched, and may be reduced in thickness. The lower gate dielectric layer 28 between the plurality of second temporary gate electrodes 32 may be partially etched, and may be reduced in thickness.

Referring to FIGS. 2 and 18, a spacer layer 36L may be formed on the top and side surfaces of the buffer layer 27, the lower gate dielectric layer 28, the plurality of first temporary gate electrodes 31, the plurality of second temporary gate electrodes 32, the second mask pattern 33, and the third mask pattern 34. A fourth mask pattern 35 may be formed on the spacer layer 36L to cover the first region 11 and expose the second region 12.

A sacrificial spacer 36 may be formed on the sidewalls of the plurality of second temporary gate electrodes 32 and the third mask pattern 34 by anisotropically etching the spacer layer 36L. The sacrificial spacer 36 may include silicon nitride. The second active region 22 may be exposed to the outside of the sacrificial spacer 36. The bottom of the sacrificial spacer 36 may be in contact with the top surface of the lower gate dielectric layer 28. The sacrificial spacer 36 may be in contact with the side surfaces of the plurality of second temporary gate electrodes 32 and the third mask pattern 34.

Figure 19:
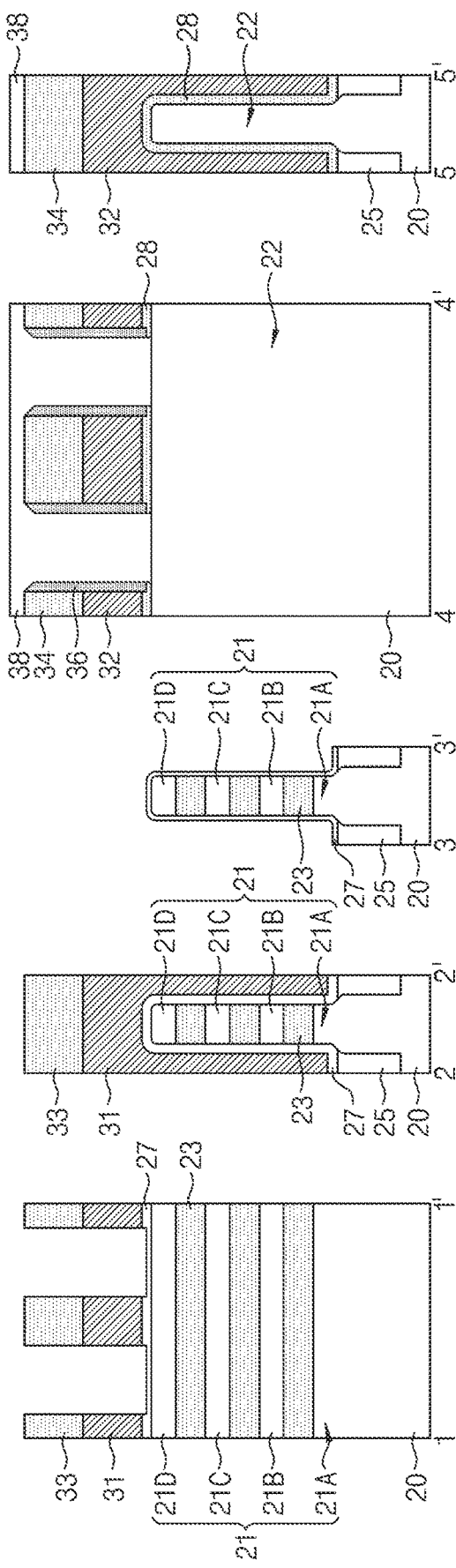

Referring to FIGS. 2 and 19, the spacer layer 36L may be exposed by removing the fourth mask pattern 35. A fifth mask pattern 38 may be formed to cover the second region 12 and expose the first region 11. The spacer layer 36L may be removed.

Figure 20:
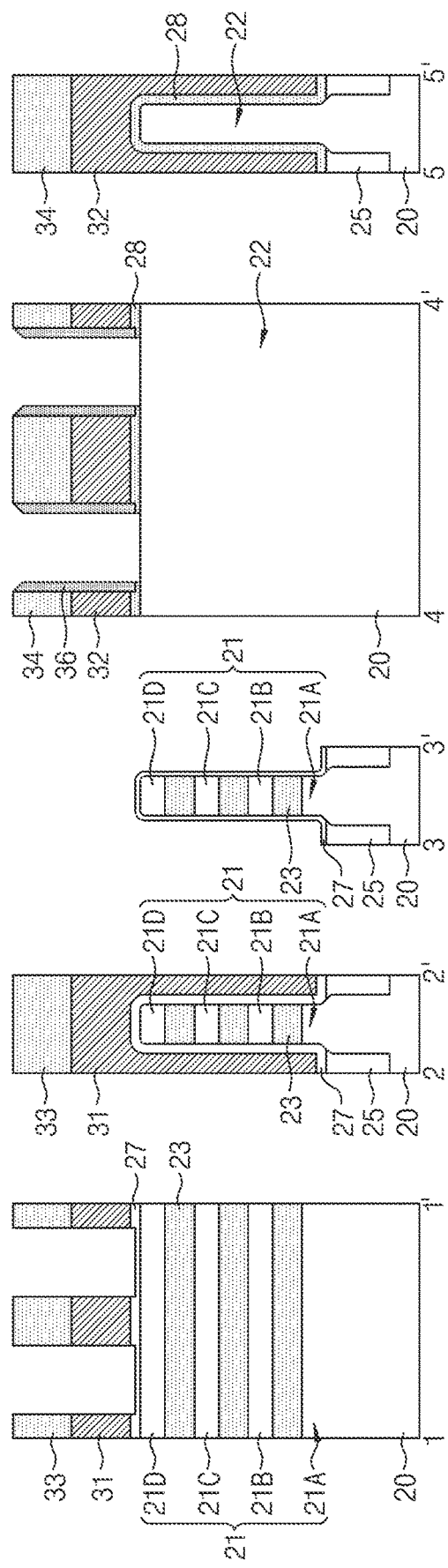

Referring to FIGS. 2 and 20, the fifth mask pattern 38 may be removed.

Figure 21:
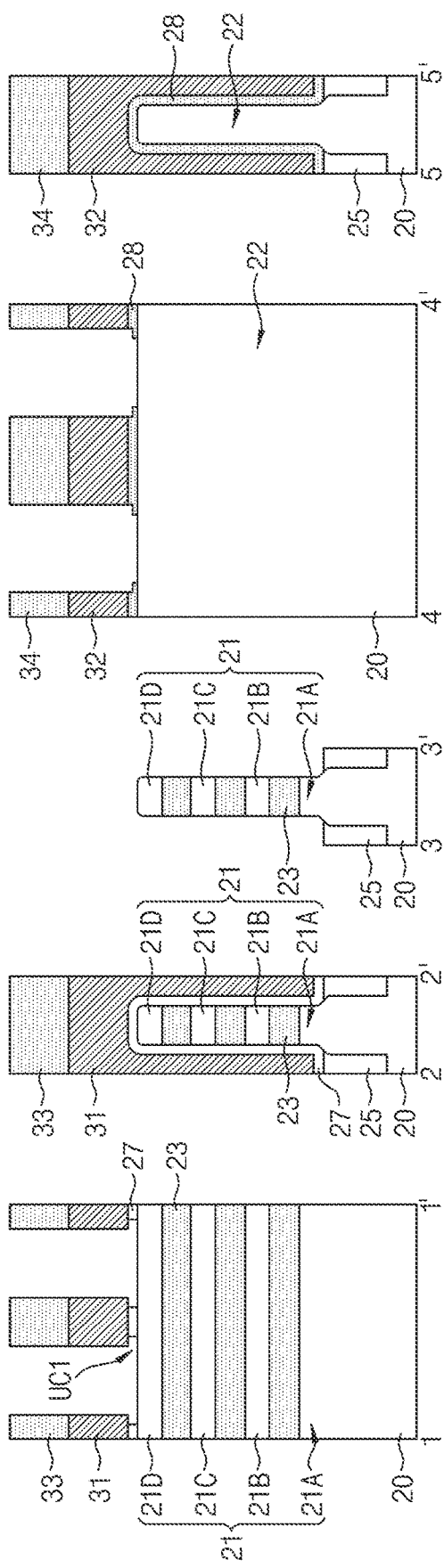

Referring to FIGS. 2 and 21, the first active region 21 may be exposed between the plurality of first temporary gate electrodes 31 by partially removing the buffer layer 27. The buffer layer 27 may be preserved between the plurality of first temporary gate electrodes 31 and the first active region 21. The buffer layer 27 may have a smaller horizontal width than each of the plurality of first temporary gate electrodes 31. A first undercut region UC1 may be formed under the plurality of first temporary gate electrodes 31. In an exemplary embodiment, the first undercut region UC1 may be formed between the plurality of first temporary gate electrodes 31 and the first active region 21.

The sidewalls of the plurality of second temporary gate electrodes 32 and the third mask pattern 34 may be exposed by removing the sacrificial spacer 36. The lower gate dielectric layer 28 may have a larger horizontal width than a corresponding one of the plurality of second temporary gate electrodes 32. The lower gate dielectric layer 28 may protrude beyond a corresponding one of the plurality of second temporary gate electrodes 32.

Figure 22:
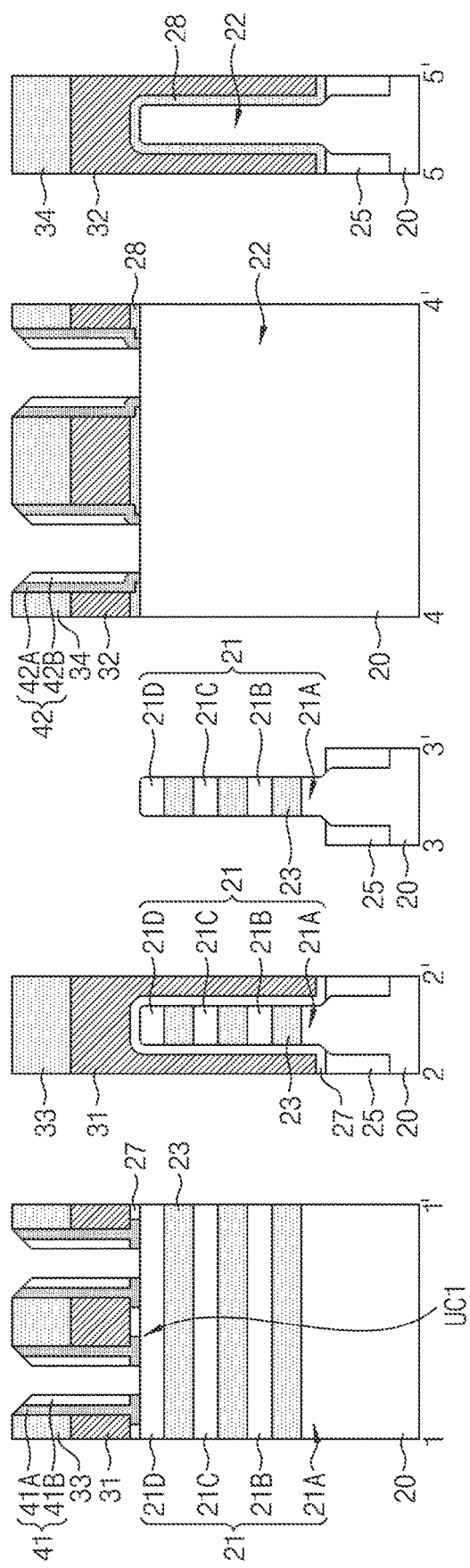

Referring to FIGS. 2 and 22, the first gate spacer 41 may be formed on the sidewalls of the plurality of first temporary gate electrodes 31 and the second mask pattern 33. The second gate spacer 42 may be formed on the sidewalls of the plurality of second temporary gate electrodes 32 and the third mask pattern 34. The first gate spacer 41 may include the first inner spacer 41A and the first outer spacer 41B. The second gate spacer 42 may include the second inner spacer 42A and the second outer spacer 42B. In an exemplary embodiment, the first inner spacer 41A and the second inner spacer 42A may include silicon nitride. The first outer spacer 41B and the second outer spacer 42B may include silicon oxide or silicon oxynitride.

The first inner spacer 41A may be formed on the sidewalls of the plurality of first temporary gate electrodes 31 and the second mask pattern 33. The first inner spacer 41A may extend in the first undercut region UC1. The first inner spacer 41A may be in contact with the bottom surfaces of the plurality of first temporary gate electrodes 31 and with the first active region 21. The first inner spacer 41A may be in contact with the side surface of the buffer layer 27. The first outer spacer 41B may be formed on the outer side surface of the first inner spacer 41A.

The second inner spacer 42A may be formed on the sidewalls of the plurality of second temporary gate electrodes 32 and the third mask pattern 34. The second inner spacer 42A may be in contact with the side and top surfaces of the lower gate dielectric layer 28. The second outer spacer 42B may be formed on the outer side surface of the second inner spacer 42A.

Figure 23:
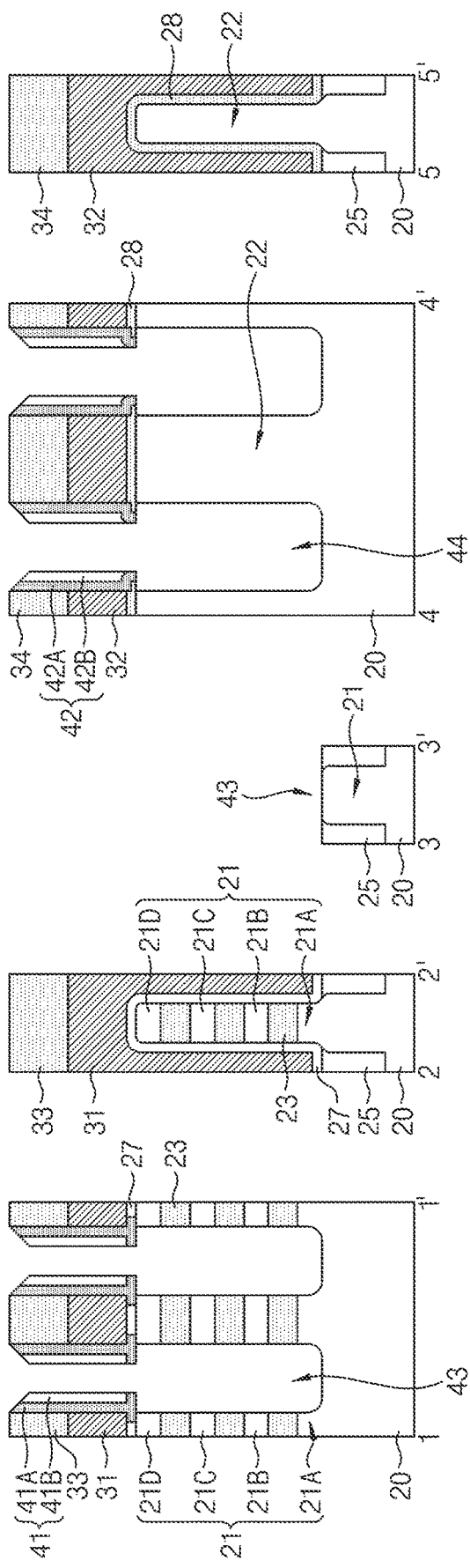

Referring to FIGS. 2 and 23, a plurality of first trenches 43 may be formed in the first active region 21 between the plurality of first temporary gate electrodes 31. A plurality of second trenches 44 may be formed in the second active region 22 between the plurality of second temporary gate electrodes 32.

Figure 24:
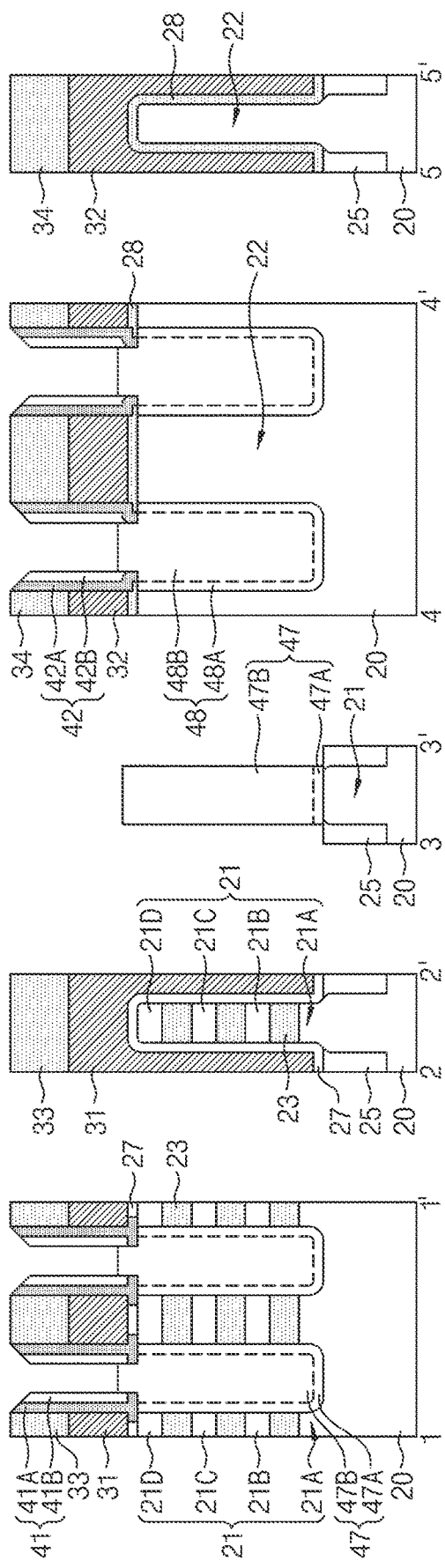

Referring to FIGS. 2 and 24, a plurality of first drain regions 47 may be formed in the plurality of first trenches 43, and a plurality of second drain regions 48 may be formed in the plurality of second trenches 44. Each of the plurality of first drain regions 47 may include a first layer 47A and a second layer 47B disposed on the first layer 47A. Each of the plurality of second drain regions 48 may include a third layer 48A and a fourth layer 48B disposed on the third layer 48A. The upper ends of the plurality of first drain regions 47 may protrude to a higher level than the upper end of the first active region 21. The upper ends of the plurality of second drain regions 48 may protrude to a higher level than the upper end of the second active region 22.

Each of the plurality of first drain regions 47 and the plurality of second drain regions 48 may be formed through a selective epitaxial growth (SEG) method. Each of the plurality of first drain regions 47 and the plurality of second drain regions 48 may include SiGe, Si, SiC, or combinations thereof. In an exemplary embodiment, each of the first layer 47A and the third layer 48A may include a Si layer, and each of the second layer 47B and the fourth layer 48B may include a SiGe layer. In an exemplary embodiment, the first layer 47A may include a SiGe layer having a lower Ge density than the second layer 47B. The third layer 48A may include a SiGe layer having a lower Ge density than the fourth layer 48B.

Figure 25:
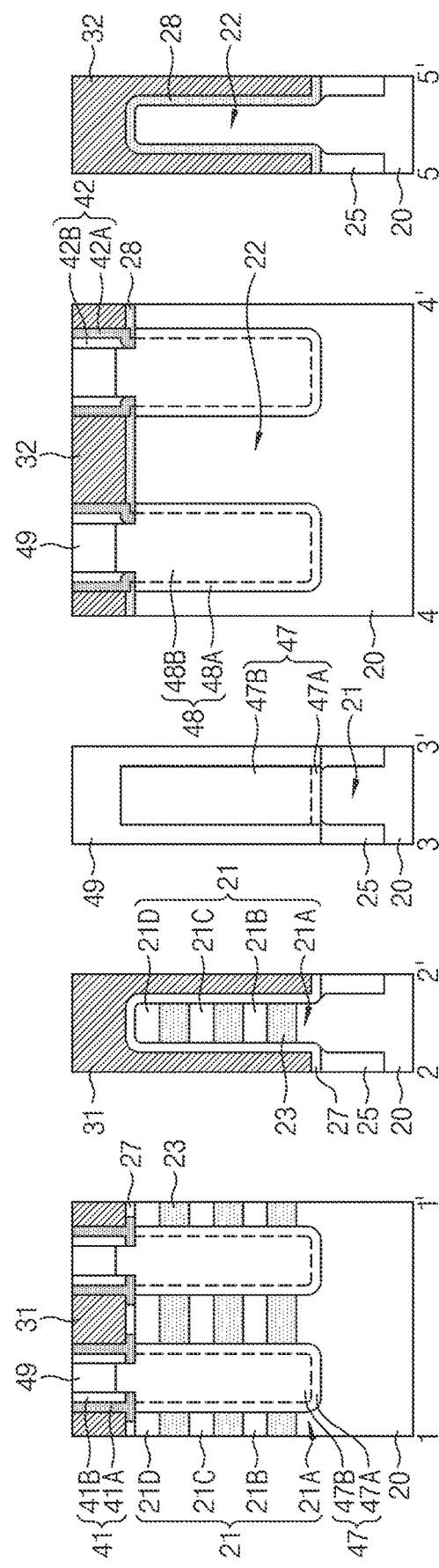

Referring to FIGS. 2 and 25, an interlayer insulating layer 49 may be formed on the plurality of first drain regions 47 and the plurality of second drain regions 48. The interlayer insulating layer 49 may include, e.g., silicon oxide, silicon nitride, silicon oxynitride, low-k dielectrics, high-k dielectrics, or combinations thereof. In an exemplary embodiment, the interlayer insulating layer 49 may include silicon oxide.

The top surfaces of the plurality of first temporary gate electrodes 31 and the plurality of second temporary gate electrodes 32 may be exposed by removing the second mask pattern 33 and the third mask pattern 34 through a planarization process. The planarization process may include a chemical mechanical polishing (CMP) process.

Figure 26:
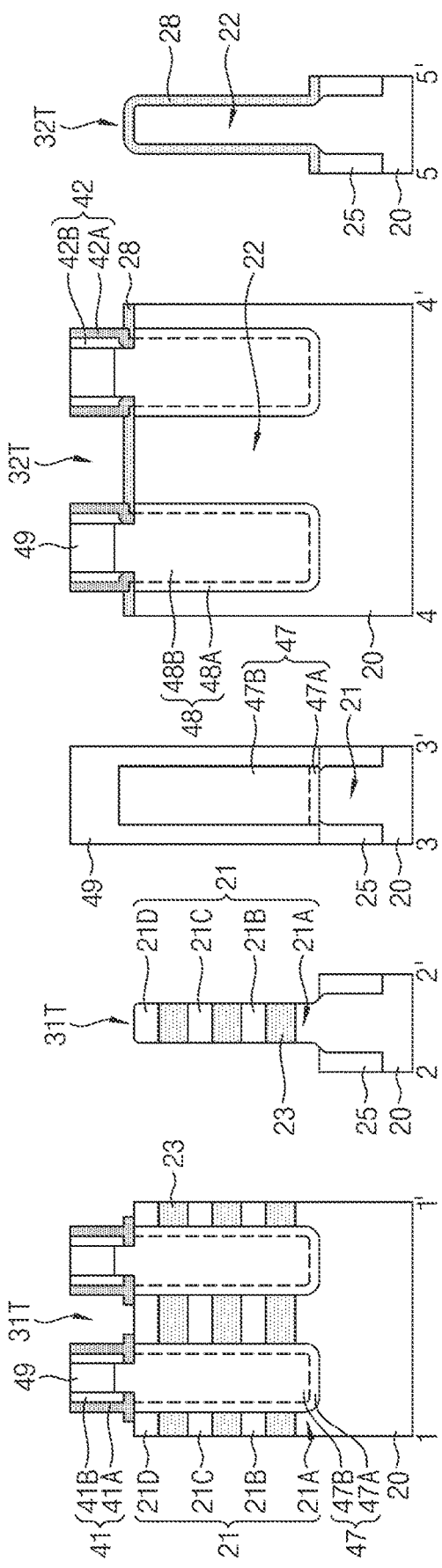

Referring to FIGS. 2 and 26, a first gate trench 31T may be formed by removing the plurality of first temporary gate electrodes 31 and the buffer layer 27. A second gate trench 32T may be formed by removing the plurality of second temporary gate electrodes 32.

Figure 27:
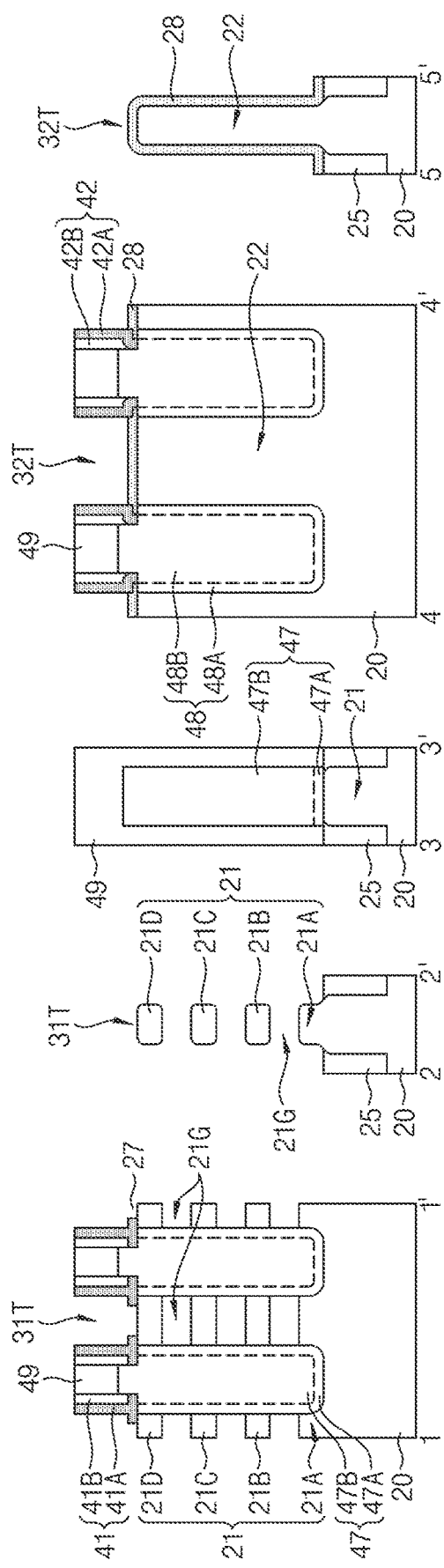

Referring to FIGS. 2 and 27, a plurality of gap regions 21G may be formed by removing the plurality of sacrificial layers 23. The plurality of gap regions 21G may communicate with the first gate trench 31T. The plurality of first drain regions 47 may be exposed in the plurality of gap regions 21G.

The first inner spacer 41A may serve to prevent damage to the plurality of first drain regions 47 during the process of removing the plurality of sacrificial layers 23. The second inner spacer 42A and the lower gate dielectric layer 28 may serve to prevent damage to the plurality of second drain regions 48 and the second active region 22 during the process of removing the plurality of sacrificial layers 23.

Referring again to FIGS. 1 and 2, the first gate dielectric layer 53 may be formed on the inner walls of the first gate trench 31T and the plurality of gap regions 21G. The second gate dielectric layer 54 may be formed on the inner walls of the second gate trench 32T. The first gate electrode 55 may be formed on the first gate dielectric layer 53 to fill the first gate trench 31T. The second gate electrode 56 may be formed on the second gate dielectric layer 54 to fill the second gate trench 32T.

Each of the first gate dielectric layer 53 and the second gate dielectric layer 54 may include, e.g., silicon oxide, silicon nitride, silicon oxynitride, high-k dielectrics, or combinations thereof. In an exemplary embodiment, each of the first gate dielectric layer 53 and the second gate dielectric layer 54 may include high-k dielectrics, e.g., metal oxide. Each of the first gate electrode 55 and the second gate electrode 56 may include, e.g., metal, metal silicide, metal nitride, metal oxide, polysilicon, conductive carbon, or combinations thereof. In an exemplary embodiment, each of the first gate electrode 55 and the second gate electrode 56 may include, e.g., work function metal.

Figure 28:
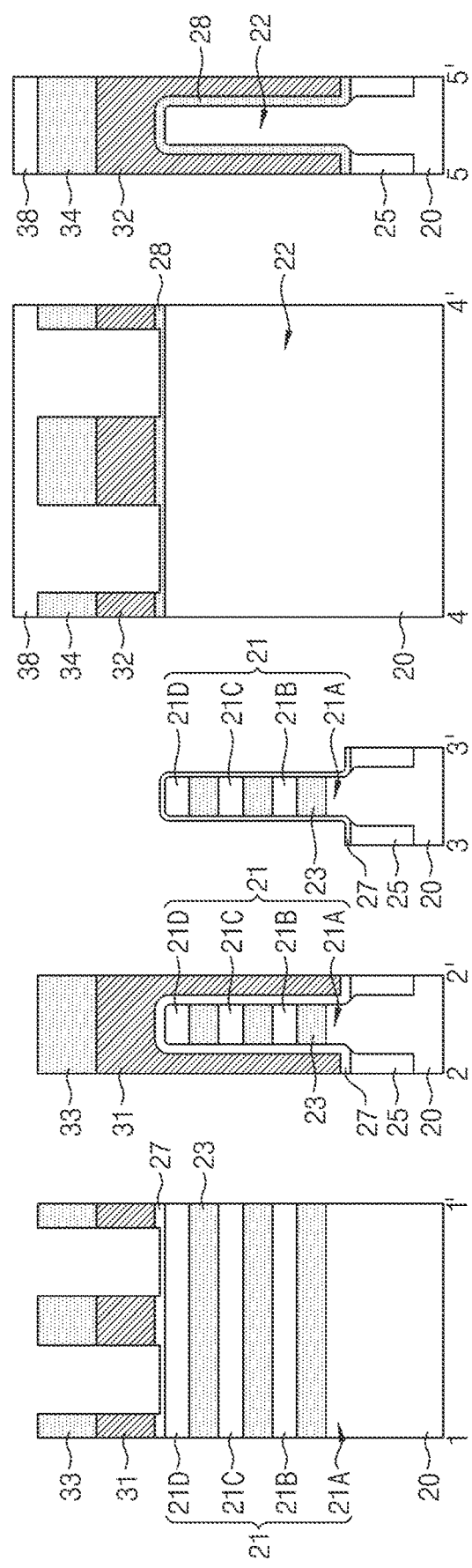
Figure 29:
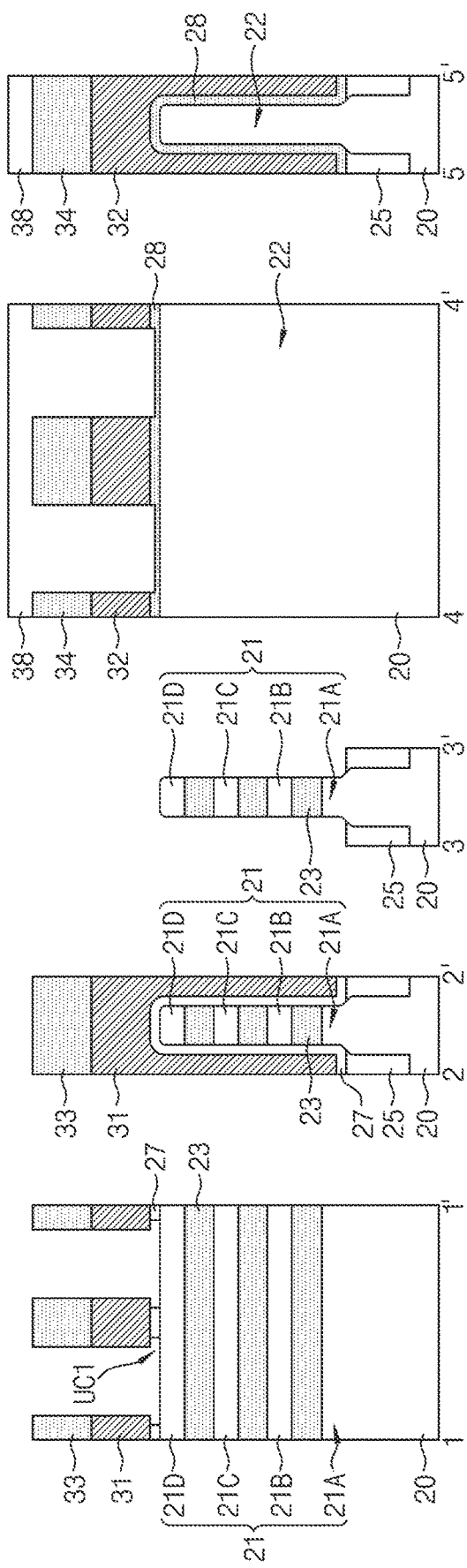
Figure 30:
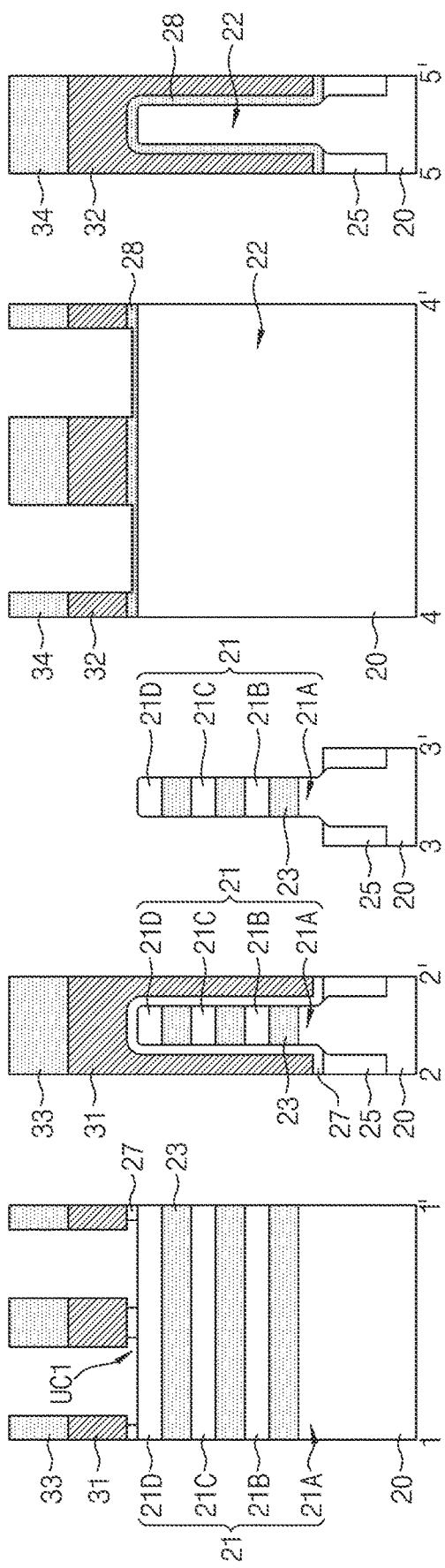

FIGS. 28 to 30 are cross-sectional views illustrating stages in methods of forming semiconductor devices according to exemplary embodiments of the disclosure. FIGS. 28 to 30 are cross-sectional views along lines 1-1', 2-2', 3-3', 4-4' and 5-5' in FIG. 2. Hereinafter, only the differences will be briefly described.

Referring to FIGS. 2 and 28, a fifth mask pattern 38 may be formed to cover the second region 12 and expose the first region 11.

Referring to FIGS. 2 and 29, the first undercut region UC1 may be formed under the plurality of first temporary gate electrodes 31 by partially removing the buffer layer 27.

Referring to FIGS. 2 and 30, the fifth mask pattern 38 may be removed.

Subsequently, semiconductor devices may be formed in a manner similar to that described with reference to FIGS. 22 to 27.

FIGS. 31 and 32 are cross-sectional views illustrating stages in methods of forming semiconductor devices according to exemplary embodiments of the disclosure. FIGS. 31 and 32 are cross-sectional views along lines 1-1', 2-2', 3-3', 4-4' and 5-5' in FIG. 2.

Referring to FIGS. 2 and 31, a temporary buffer layer 27A and a lower gate dielectric layer 28 may be formed. In an exemplary embodiment, the temporary buffer layer 27A may be formed through the same process as the lower gate dielectric layer 28 simultaneously therewith, and may include substantially the same material as the lower gate dielectric layer 28. The temporary buffer layer 27A and the lower gate dielectric layer 28 may include, e.g., silicon oxynitride or silicon nitride.

Referring to FIGS. 2 and 32, a fifth mask pattern 38 may be formed to cover the lower gate dielectric layer 28 and expose the temporary buffer layer 27A. The buffer layer 27 may be formed by removing nitrogen in the temporary buffer layer 27A through a surface modification process, e.g., a descum process. The nitrogen concentration in the buffer layer 27 may be lower than that in the lower gate dielectric layer 28. The buffer layer 27 may have etch selectivity with respect to the lower gate dielectric layer 28. The buffer layer 27 may have a higher etching rate than the lower gate dielectric layer 28. The fifth mask pattern 38 may be removed. Subsequently, semiconductor devices may be formed in a manner similar to that described with reference to FIGS. 17 to 29.

FIGS. 33 to 37 are cross-sectional views illustrating stages in methods of forming semiconductor devices according to exemplary embodiments of the disclosure. FIGS. 33 to 37 are cross-sectional views along lines 1-1', 2-2', 3-3', 4-4' and 5-5' in FIG. 2.

Figure 33:
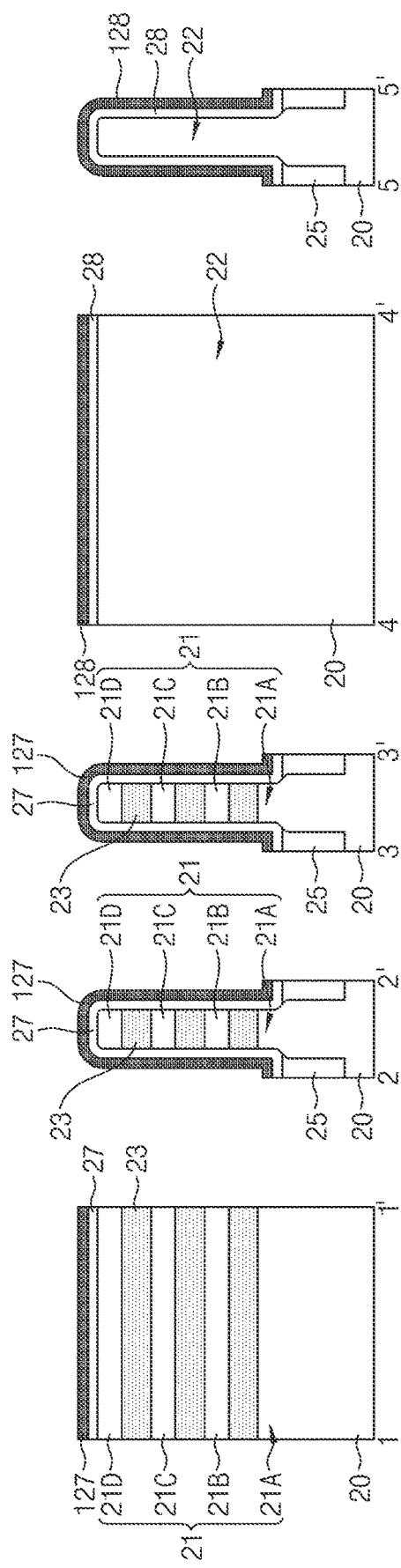

Referring to FIGS. 2 and 33, a sacrificial buffer layer 127 may be formed on the buffer layer 27. An intermediate gate dielectric layer 128 may be formed on the lower gate dielectric layer 28. The buffer layer 27 may be formed through the same process as the lower gate dielectric layer 28 simultaneously therewith, and may include substantially the same material as the lower gate dielectric layer 28. The sacrificial buffer layer 127 may be formed through the same process as the intermediate gate dielectric layer 128 simultaneously therewith, and may include substantially the same material as the intermediate gate dielectric layer 128.

In an exemplary embodiment, each of the buffer layer 27 and the lower gate dielectric layer 28 may include, e.g., silicon oxide or silicon oxynitride. The sacrificial buffer layer 127 and the intermediate gate dielectric layer 128 may include different materials from the buffer layer 27 and the lower gate dielectric layer 28. The sacrificial buffer layer 127 and the intermediate gate dielectric layer 128 may include silicon oxynitride or silicon nitride.

Figure 34:
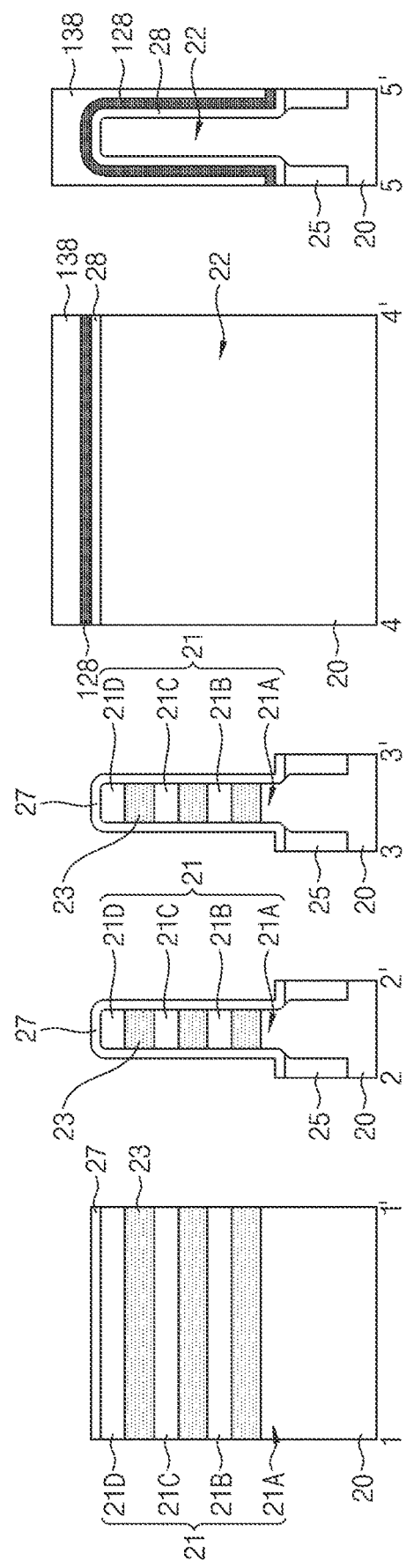

Referring to FIGS. 2 and 34, a sixth mask pattern 138 may be formed to cover the intermediate gate dielectric layer 128. The sacrificial buffer layer 127 may be removed through an isotropic etching process to expose the buffer layer 27. The sixth mask pattern 138 may be removed.

Figure 35:
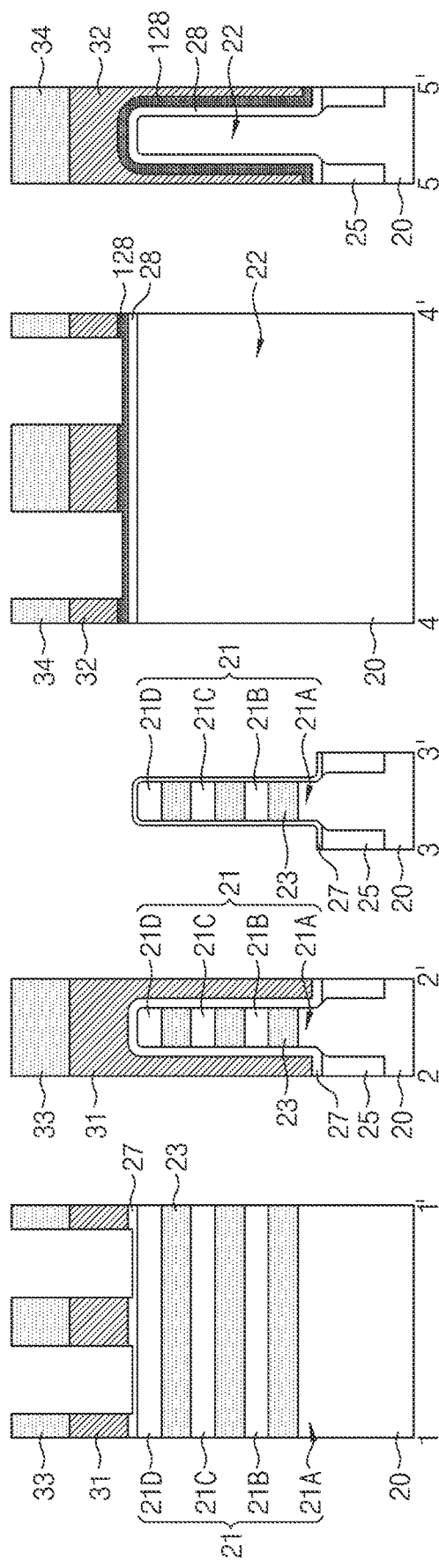

Referring to FIGS. 2 and 35, a plurality of first temporary gate electrodes 31, a plurality of second temporary gate electrodes 32, a second mask pattern 33, and a third mask pattern 34 may be formed.

Figure 36:
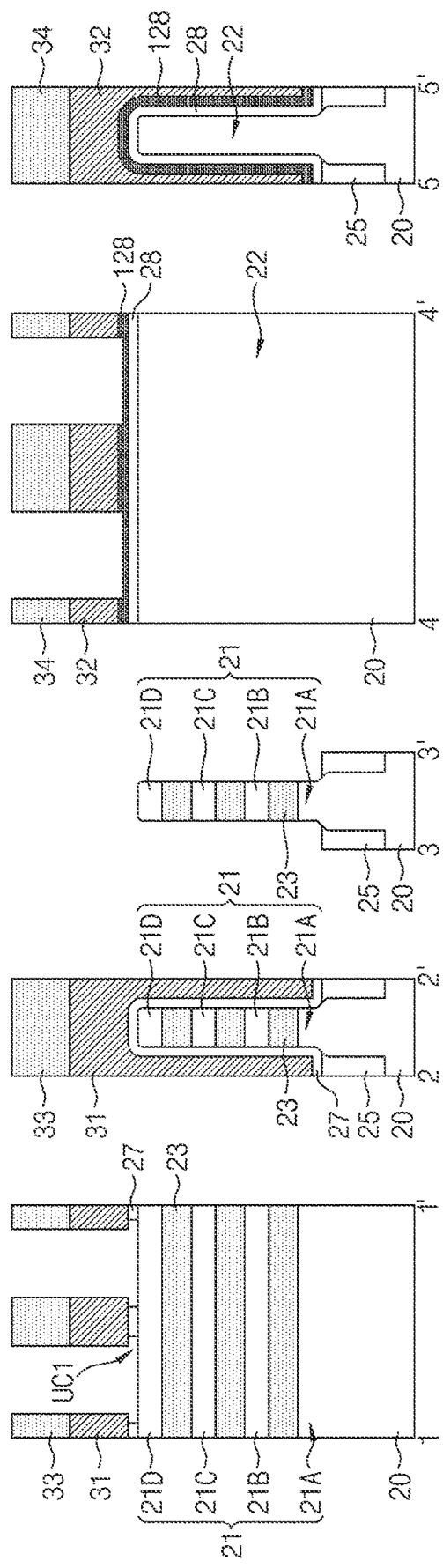

Referring to FIGS. 2 and 36, the first active region 21 may be exposed between the plurality of first temporary gate electrodes 31 by partially removing the buffer layer 27. The buffer layer 27 may be preserved between the plurality of first temporary gate electrodes 31 and the first active region 21. The buffer layer 27 may have a smaller horizontal width than each of the plurality of first temporary gate electrodes 31. A first undercut region UC1 may be formed under the plurality of first temporary gate electrodes 31. In an exemplary embodiment, the first undercut region UC1 may be formed between the plurality of first temporary gate electrodes 31 and the first active region 21. The intermediate gate dielectric layer 128 may serve to prevent etching damage to the lower gate dielectric layer 28 during the process of forming the first undercut region UC1.

Referring to FIGS. 2 and 37, the first gate spacer 41 may be formed on the sidewalls of the plurality of first temporary gate electrodes 31 and the second mask pattern 33. The second gate spacer 42 may be formed on the sidewalls of the plurality of second temporary gate electrodes 32 and the third mask pattern 34. The first gate spacer 41 may include the first inner spacer 41A and the first outer spacer 41B. The second gate spacer 42 may include the second inner spacer 42A and the second outer spacer 42B.

The first inner spacer 41A may extend in the first undercut region UC1. The second inner spacer 42A may be formed on the sidewalls of the plurality of second temporary gate electrodes 32 and the third mask pattern 34. The lower end of the second inner spacer 42A may be in contact with the top surface of the intermediate gate dielectric layer 128.

Referring again to FIGS. 2 and 9, the intermediate gate dielectric layer 128 may be preserved on the lower gate dielectric layer 28. The second gate dielectric layer 54 may be formed on the intermediate gate dielectric layer 128. The intermediate gate dielectric layer 128 may have a larger horizontal width than the second gate electrode 56. The intermediate gate dielectric layer 128 may protrude beyond the second gate electrode 56.

FIGS. 38 to 42 are cross-sectional views illustrating stages in methods of forming semiconductor devices according to exemplary embodiments of the disclosure. FIGS. 38 to 42 are cross-sectional views along lines 1-1', 2-2', 3-3', 4-4' and 5-5' in FIG. 2.

Referring to FIGS. 2 and 38, the temporary buffer layer 27A and a temporary lower gate dielectric layer 28A may be formed. The temporary buffer layer 27A may be thicker than the temporary lower gate dielectric layer 28A. In an exemplary embodiment, the temporary buffer layer 27A and the temporary lower gate dielectric layer 28A may include the same material. The temporary buffer layer 27A and the temporary lower gate dielectric layer 28A may include silicon oxide.

Figure 39:
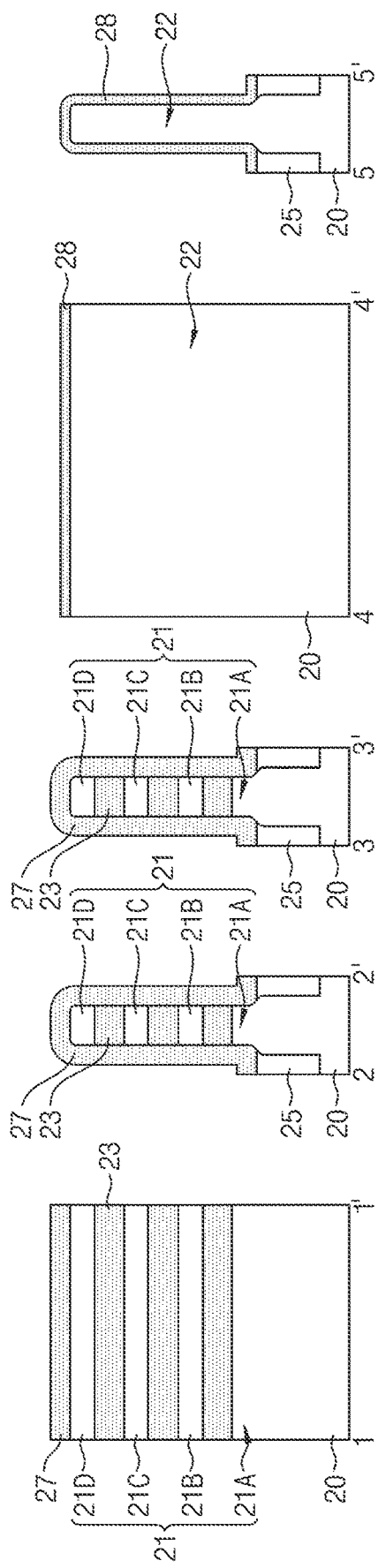

Referring to FIGS. 2 and 39, the buffer layer 27 and a lower gate dielectric layer 28 may be formed by injecting nitrogen into the temporary buffer layer 27A and the temporary lower gate dielectric layer 28A. In an exemplary embodiment, the injecting nitrogen into the temporary buffer layer 27A and the temporary lower gate dielectric layer 28A may include a decoupled plasma nitridation (DPN) process, a post-nitridation annealing (PNA) process, or a combination thereof.

Figure 40:
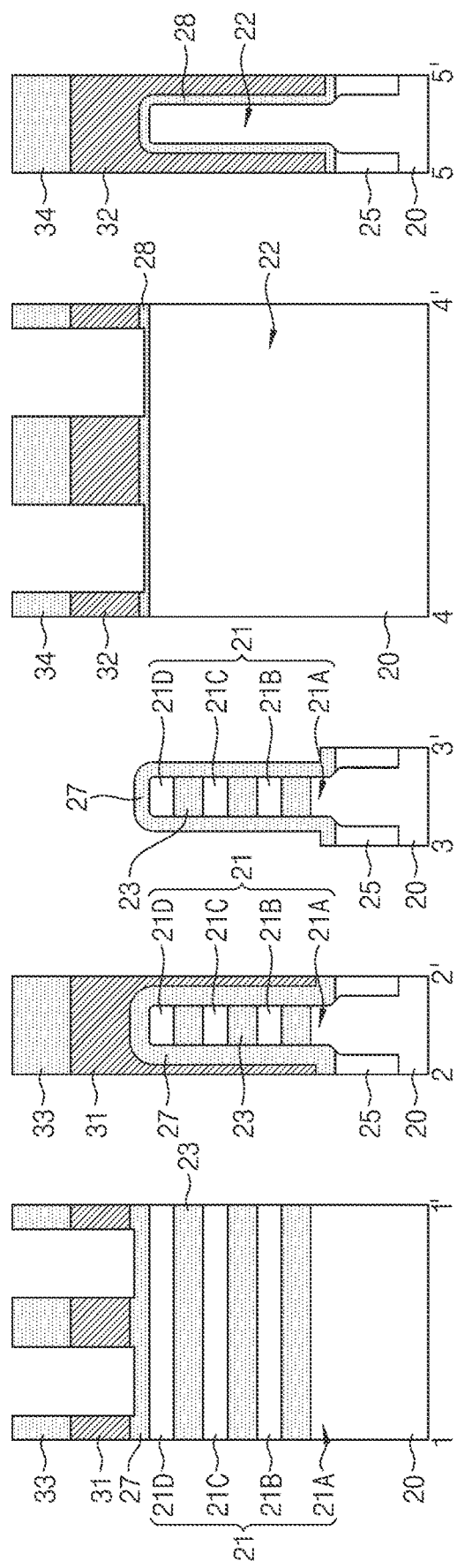

Referring to FIGS. 2 and 40, a plurality of first temporary gate electrodes 31, a plurality of second temporary gate electrodes 32, a second mask pattern 33, and a third mask pattern 34 may be formed.

Figure 41:
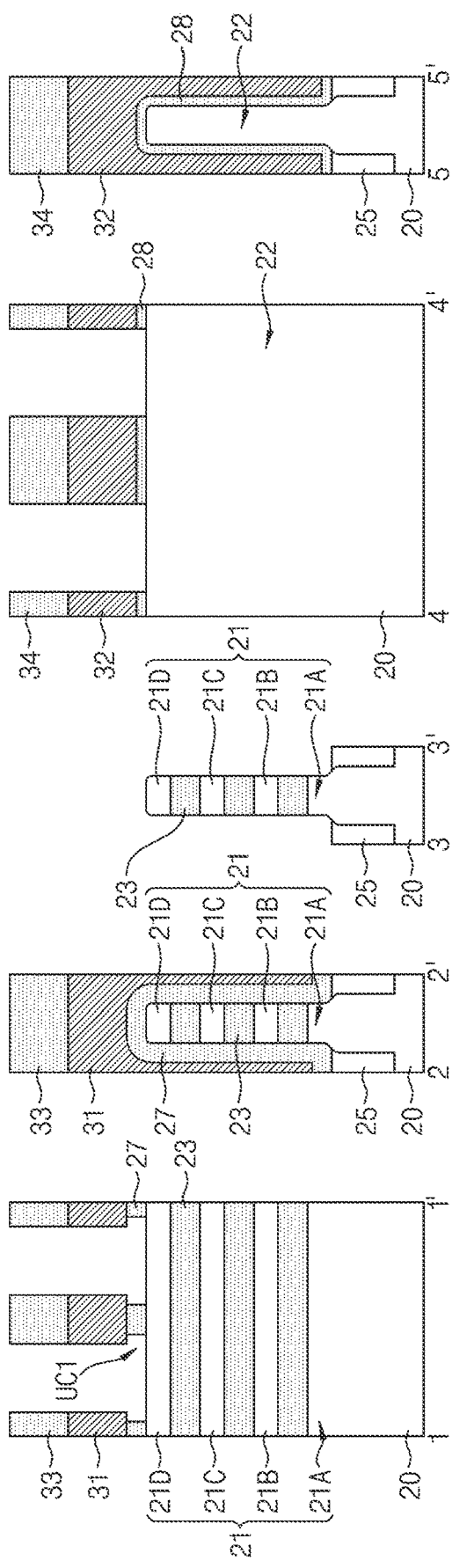

Referring to FIGS. 2 and 41, the first active region 21 may be exposed between the plurality of first temporary gate electrodes 31 by partially removing the buffer layer 27. The buffer layer 27 may be preserved between the plurality of first temporary gate electrodes 31 and the first active region 21. A first undercut region UC1 may be formed under the plurality of first temporary gate electrodes 31.

The lower gate dielectric layer 28 may be partially removed during the process of forming the first undercut region UC1. The lower gate dielectric layer 28 may be preserved between the plurality of second temporary gate electrodes 32 and the second active region 22. Since the lower gate dielectric layer 28 is thinner than the buffer layer 27, the rate at which the lower gate dielectric layer 28 is etched between the plurality of second temporary gate electrodes 32 and the second active region 22 may be reduced during the process of forming the first undercut region UC1. In an exemplary embodiment, the horizontal width of the lower gate dielectric layer 28 may be substantially the same as that of a neighboring one of the plurality of second temporary gate electrodes 32, or may be larger than that of a neighboring one of the plurality of second temporary gate electrodes 32.

Figure 42:
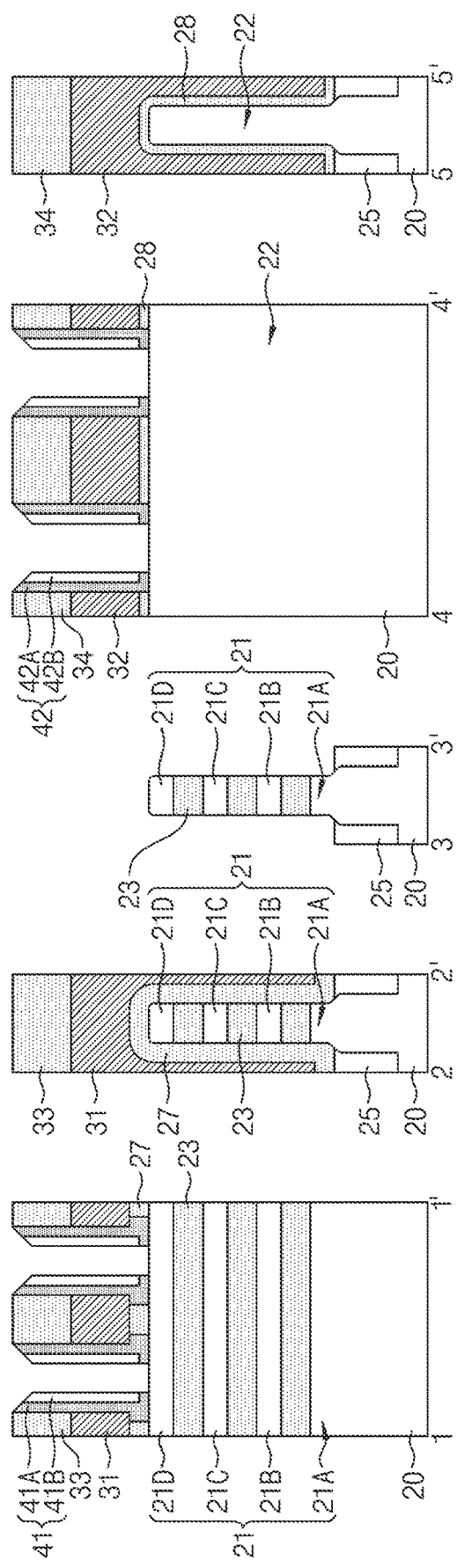

Referring to FIGS. 2 and 42, the first gate spacer 41 may be formed on the sidewalls of the plurality of first temporary gate electrodes 31 and the second mask pattern 33. The second gate spacer 42 may be formed on the sidewalls of the plurality of second temporary gate electrodes 32 and the third mask pattern 34. The first gate spacer 41 may have various thicknesses and shapes. In an exemplary embodiment, the portion of the first gate spacer 41 that is located between the plurality of first temporary gate electrodes 31 and the first active region 21 may be thicker than the lower gate dielectric layer 28. The outermost portion of the lower gate dielectric layer 28 may be aligned with the side surfaces of the plurality of second temporary gate electrodes 32. In an exemplary embodiment, the side surface of the lower gate dielectric layer 28 and the side surfaces of the plurality of second temporary gate electrodes 32 may form substantially the same plane.

Referring again to FIGS. 2 and 10, the portion of the first gate spacer 41 that is located between the first gate electrode 55 and the first active region 21 may be thicker than the lower gate dielectric layer 28. The outermost portion of the lower gate dielectric layer 28 may be aligned between the second gate spacer 42 and the second gate electrode 56.

FIGS. 43 to 46 are cross-sectional views illustrating stages in methods of forming semiconductor devices according to exemplary embodiments of the disclosure. FIGS. 43 to 46 are cross-sectional views along lines 1-1', 2-2', 3-3', 4-4' and 5-5' in FIG. 2.

Referring to FIGS. 2 and 43, the sacrificial buffer layer 127 may be formed on the buffer layer 27. A lower gate dielectric layer 28 may be formed on the second active region 22. In an exemplary embodiment, the sacrificial buffer layer 127 may include a material having etch selectivity with respect to the buffer layer 27. The lower gate dielectric layer 28 may be formed through the same process as the sacrificial buffer layer 127 simultaneously therewith, and may include substantially the same material as the sacrificial buffer layer 127. The buffer layer 27 may include silicon oxide or silicon oxynitride. The lower gate dielectric layer 28 and the sacrificial buffer layer 127 may include silicon oxynitride or silicon nitride.

Referring to FIGS. 2 and 44, a plurality of first temporary gate electrodes 31, a plurality of second temporary gate electrodes 32, a second mask pattern 33, and a third mask pattern 34 may be formed.

Figure 45:
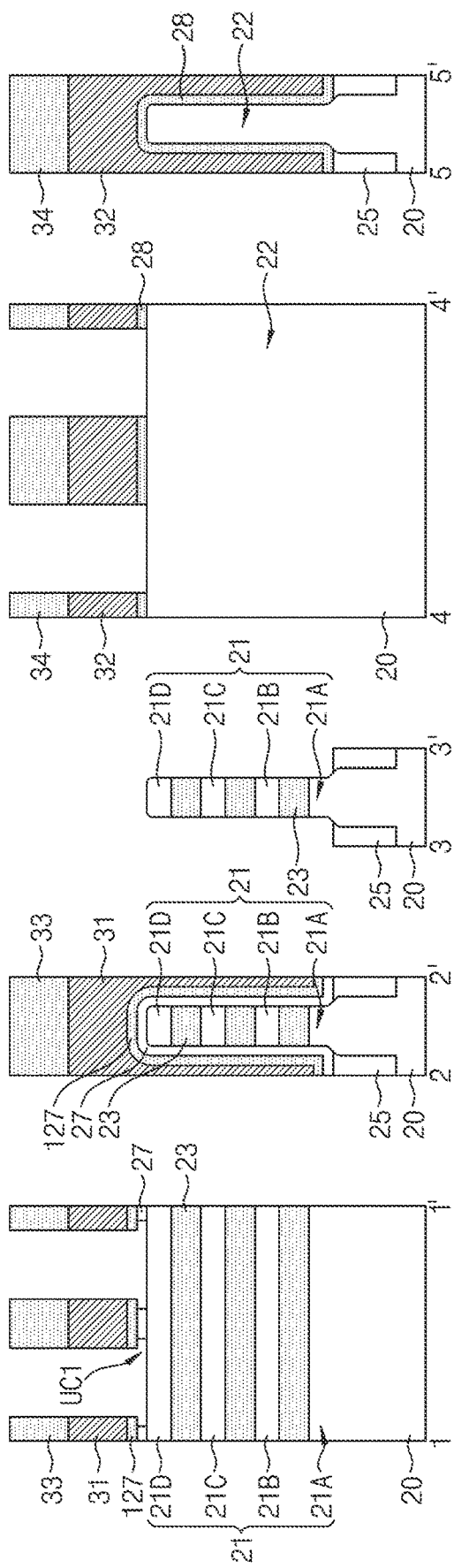

Referring to FIGS. 2 and 45, the first active region 21 may be exposed by partially removing the sacrificial buffer layer 127 and the buffer layer 27. The sacrificial buffer layer 127 may be preserved under the plurality of first temporary gate electrodes 31. The sacrificial buffer layer 127 may have substantially the same horizontal width as a neighboring one of the plurality of first temporary gate electrodes 31. A first undercut region UC1 may be formed under the sacrificial buffer layer 127. The lower gate dielectric layer 28 may be partially removed to expose the second active region 22 during the process of removing the sacrificial buffer layer 127. The lower gate dielectric layer 28 may have substantially the same horizontal width as a neighboring one of the plurality of second temporary gate electrodes 32.

Figure 46:
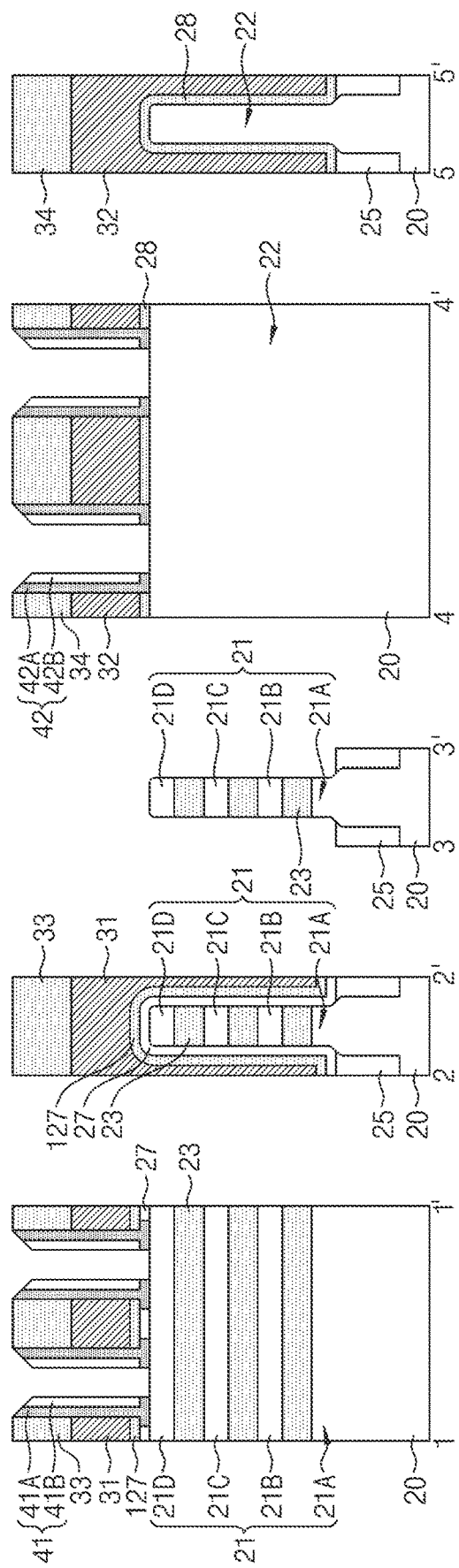

Referring to FIGS. 2 and 46, the first gate spacer 41 may be formed on the sidewalls of the plurality of first temporary gate electrodes 31 and the second mask pattern 33. The second gate spacer 42 may be formed on the sidewalls of the plurality of second temporary gate electrodes 32 and the third mask pattern 34.

Referring again to FIGS. 2 and 11, the outermost portion of the lower gate dielectric layer 28 may be aligned between the second gate spacer 42 and the second gate electrode 56.

FIGS. 47 to 51 are cross-sectional views illustrating stages in methods of forming semiconductor devices according to exemplary embodiments of the disclosure. FIGS. 47 to 51 are cross-sectional views along lines 1-1', 2-2', 3-3', 4-4' and 5-5' in FIG. 2.

Referring to FIGS. 2 and 47, the buffer layer 27 and the sacrificial buffer layer 127 may be sequentially stacked on the first region 11 and the second region 12. The buffer layer 27 and the sacrificial buffer layer 127 may cover the first active region 21 and the second active region 22. In an exemplary embodiment, the sacrificial buffer layer 127 may include a material having etch selectivity with respect to the buffer layer 27. The buffer layer 27 may include silicon oxide or silicon oxynitride. The sacrificial buffer layer 127 may include silicon oxynitride or silicon nitride. A first mask pattern 29 may be formed to cover the first region 11 and expose the second region 12.

Referring to FIGS. 2 and 48, the buffer layer 27 may be exposed by removing the sacrificial buffer layer 127 in the second region 12.

Figure 49:
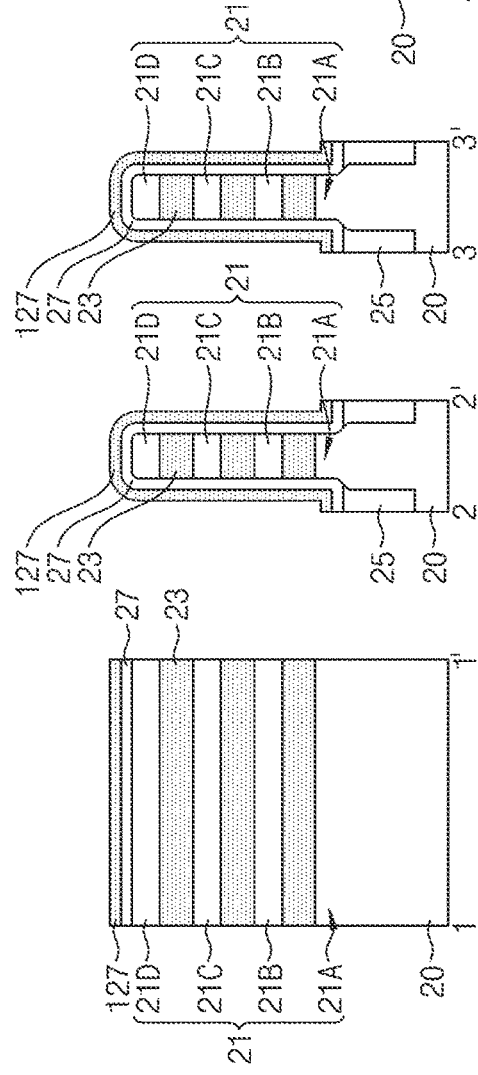

Referring to FIGS. 2 and 49, the sacrificial buffer layer 127 in the first region 11 may be exposed by removing the first mask pattern 29. The second active region 22 may be exposed by removing the buffer layer 27 in the second region 12.

Figure 50:
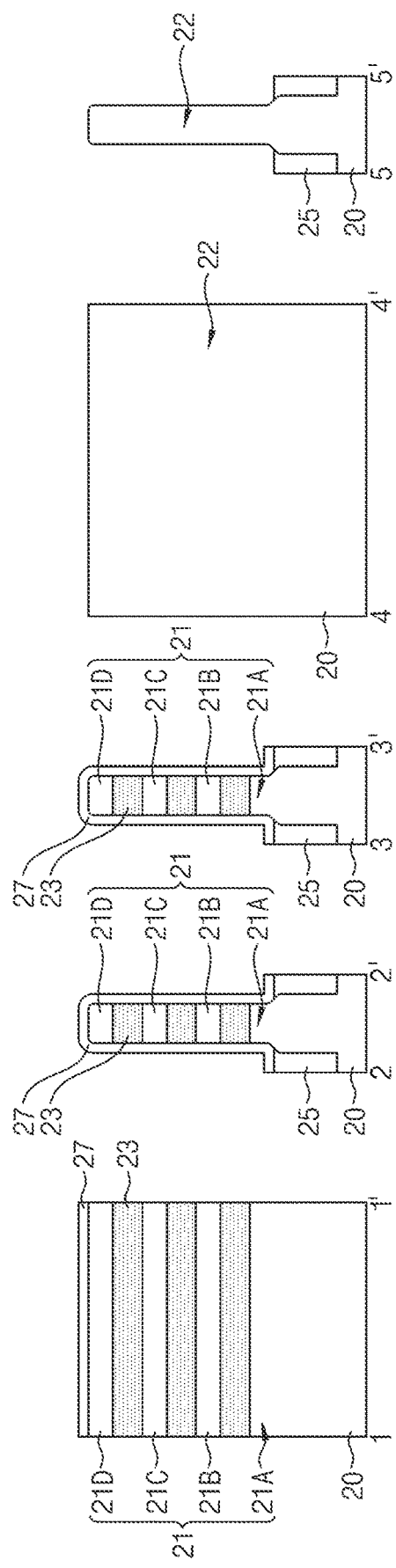

Referring to FIGS. 2 and 50, the buffer layer 27 may be exposed by removing the sacrificial buffer layer 127 in the first region 11. The buffer layer 27 may cover the first active region 21.

Referring to FIGS. 2 and 51, an upper buffer layer 227 may be formed on the buffer layer 27 in the first region 11. A lower gate dielectric layer 28 may be formed on the second active region 22. The lower gate dielectric layer 28 may be formed through the same process as the upper buffer layer 227 simultaneously therewith, and may include substantially the same material as the upper buffer layer 227.

Subsequently, semiconductor devices may be formed in a manner similar to that described with reference to FIGS. 38 to 46.

Figure 53:
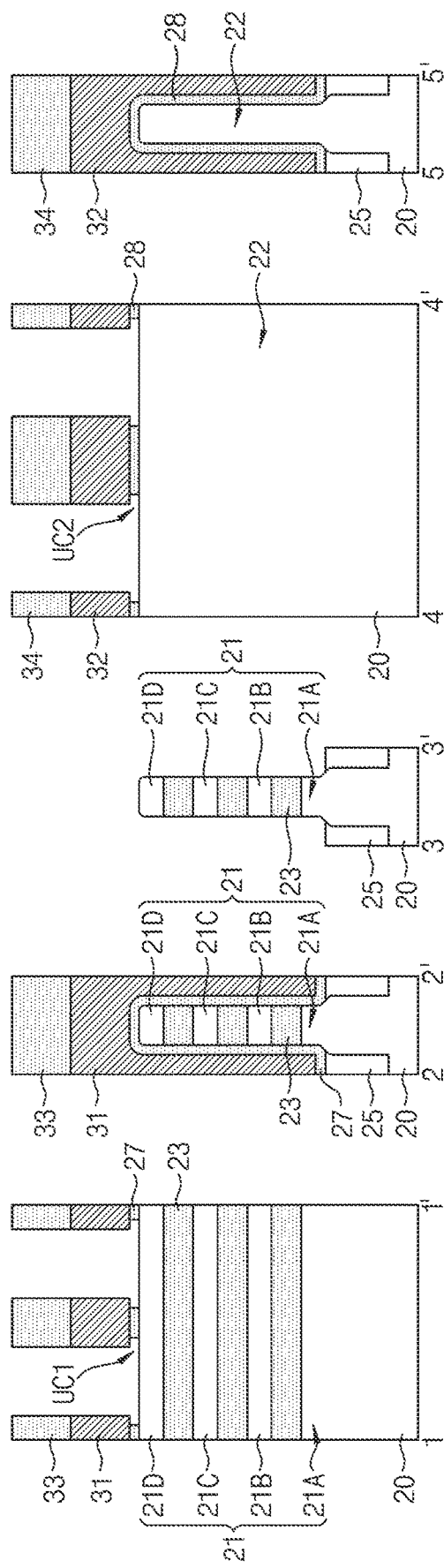
Figure 54:
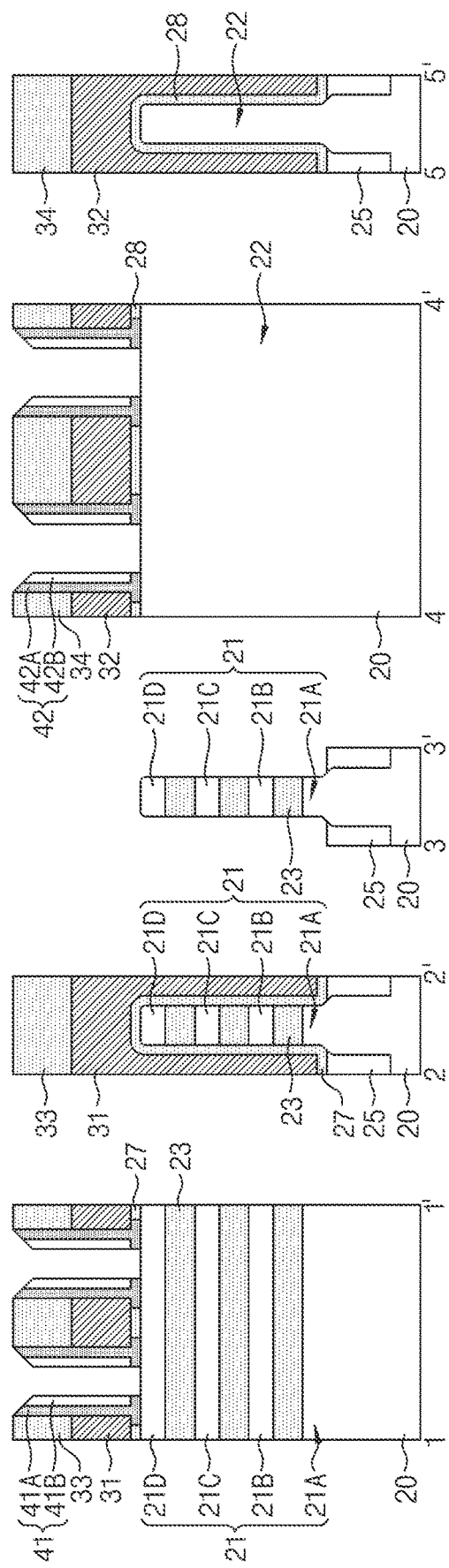

FIGS. 52 to 54 are cross-sectional views illustrating stages in methods of forming semiconductor devices according to exemplary embodiments of the disclosure. FIGS. 52 to 54 are cross-sectional views along lines 1-1', 2-2', 3-3', 4-4' and 5-5' in FIG. 2.

Referring to FIGS. 2 and 52, a buffer layer 27, a lower gate dielectric layer 28, a plurality of first temporary gate electrodes 31, a plurality of second temporary gate electrodes 32, a second mask pattern 33, and a third mask pattern 34 may be formed. The lower gate dielectric layer 28 may be formed through the same process as the buffer layer 27 simultaneously therewith, and may include substantially the same material as the buffer layer 27.

Referring to FIGS. 2 and 53, the first active region 21 may be exposed between the plurality of first temporary gate electrodes 31 by partially removing the buffer layer 27. The buffer layer 27 may have a smaller horizontal width than each of the plurality of first temporary gate electrodes 31. A first undercut region UC1 may be formed under the plurality of first temporary gate electrodes 31.

The second active region 22 may be exposed between the plurality of second temporary gate electrodes 32 by partially removing the lower gate dielectric layer 28. The lower gate dielectric layer 28 may be preserved between the plurality of second temporary gate electrodes 32 and the second active region 22. The lower gate dielectric layer 28 may have a smaller horizontal width than each of the plurality of second temporary gate electrodes 32. A second undercut region UC2 may be formed under the plurality of second temporary gate electrodes 32. In an exemplary embodiment, the second undercut region UC2 may be formed between the plurality of second temporary gate electrodes 32 and the second active region 22. Formation of the first undercut region UC1 and formation of the second undercut region UC2 may be performed simultaneously through the same process.

Referring to FIGS. 2 and 54, the first gate spacer 41 may be formed on the sidewalls of the plurality of first temporary gate electrodes 31 and the second mask pattern 33. The second gate spacer 42 may be formed on the sidewalls of the plurality of second temporary gate electrodes 32 and the third mask pattern 34. The first gate spacer 41 may include the first inner spacer 41A and the first outer spacer 41B. The second gate spacer 42 may include the second inner spacer 42A and the second outer spacer 42B. In an exemplary embodiment, the second gate spacer 42 may have a shape similar to that of the first gate spacer 41.

The second inner spacer 42A may be formed on the sidewalls of the plurality of second temporary gate electrodes 32 and the third mask pattern 34. The second inner spacer 42A may extend in the second undercut region UC2. The second inner spacer 42A may be in contact with the bottom surfaces of the plurality of second temporary gate electrodes 32 and with the second active region 22. The second inner spacer 42A may be in contact with the side surface of the lower gate dielectric layer 28.

Referring again to FIGS. 2 and 12, the first gate spacer 41 may extend in the first undercut region UC1 between the first active region 21 and the first gate electrode 55. The lower gate dielectric layer 28 may have a smaller horizontal width than the second gate electrode 56. The second gate spacer 42 may extend in the second undercut region UC2 between the second active region 22 and the second gate electrode 56.

Figure 55:
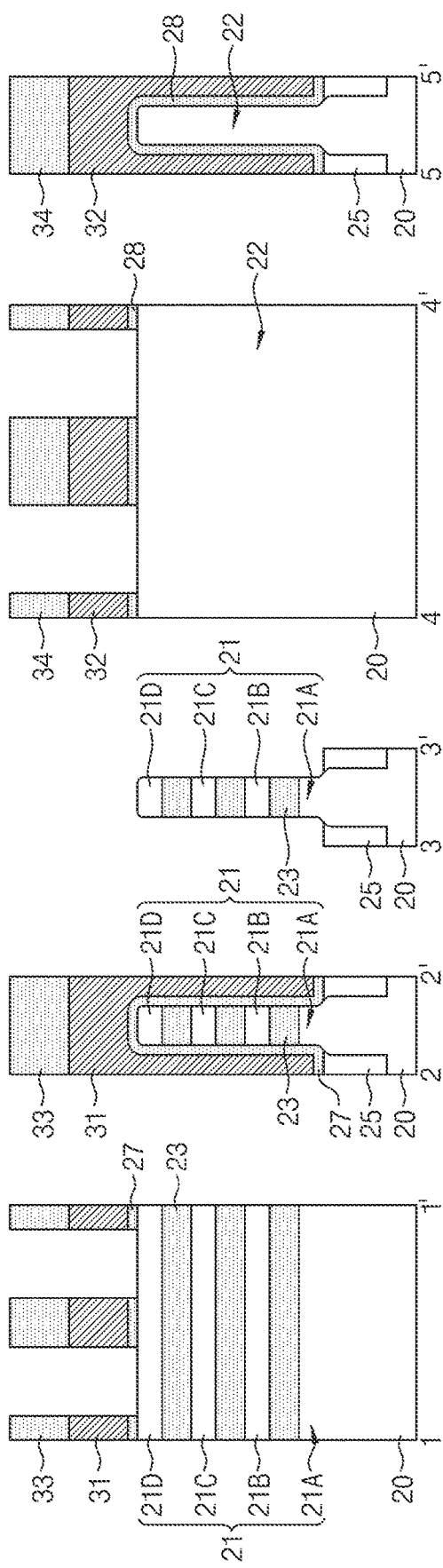
Figure 56:
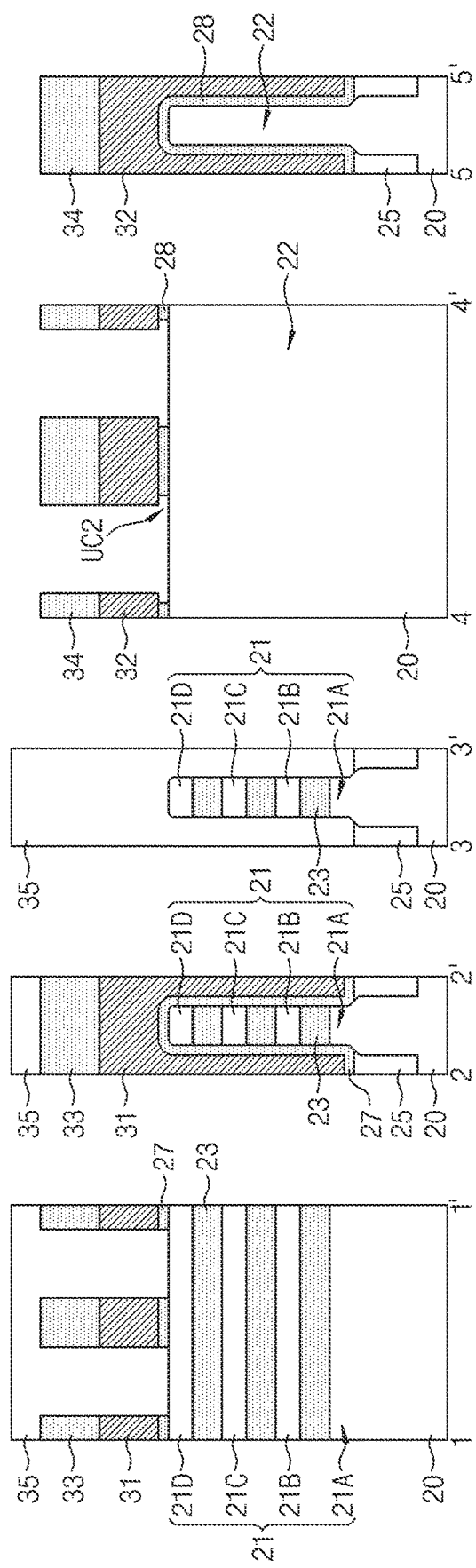

FIGS. 55 to 57 are cross-sectional views illustrating stages in methods of forming semiconductor devices according to exemplary embodiments of the disclosure. FIGS. 55 to 57 are cross-sectional views along lines 1-1', 2-2', 3-3', 4-4' and 5-5' in FIG. 2.

Referring to FIGS. 2 and 55, a buffer layer 27, a lower gate dielectric layer 28, a plurality of first temporary gate electrodes 31, a plurality of second temporary gate electrodes 32, a second mask pattern 33, and a third mask pattern 34 may be formed.

A first active region 21 may be exposed between the plurality of first temporary gate electrodes 31. The buffer layer 27 may be preserved between the plurality of first temporary gate electrodes 31 and the first active region 21. The buffer layer 27 may have substantially the same horizontal width as a neighboring one of the plurality of first temporary gate electrodes 31. The side surface of the buffer layer 27 and the side surfaces of the plurality of first temporary gate electrodes 31 may form substantially the same plane.

A second active region 22 may be exposed between the plurality of second temporary gate electrodes 32. The lower gate dielectric layer 28 may be preserved between the plurality of second temporary gate electrodes 32 and the second active region 22. The lower gate dielectric layer 28 may have substantially the same horizontal width as a neighboring one of the plurality of second temporary gate electrodes 32. The side surface of the lower gate dielectric layer 28 and the side surfaces of the plurality of second temporary gate electrodes 32 may form substantially the same plane.

Referring to FIGS. 2 and 56, the fourth mask pattern 35 may be formed to cover the first region 11. A second undercut region UC2 may be formed under the plurality of second temporary gate electrodes 32 by partially removing the lower gate dielectric layer 28. The lower gate dielectric layer 28 may have a smaller horizontal width than each of the plurality of second temporary gate electrodes 32. In an exemplary embodiment, the second undercut region UC2 may be formed between the plurality of second temporary gate electrodes 32 and the second active region 22.

Referring to FIGS. 2 and 57, the fourth mask pattern 35 may be removed. A first gate spacer 41 may be formed on the sidewalls of the plurality of first temporary gate electrodes 31 and the second mask pattern 33. A second gate spacer 42 may be formed on the sidewalls of the plurality of second temporary gate electrodes 32 and the third mask pattern 34.

The first inner spacer 41A may be formed on the sidewalls of the plurality of first temporary gate electrodes 31 and the second mask pattern 33. The first inner spacer 41A may be in contact with the side surface of the buffer layer 27. The first inner spacer 41A may be aligned outside the plurality of first temporary gate electrodes 31. The second inner spacer 42A may be formed on the sidewalls of the plurality of second temporary gate electrodes 32 and the third mask pattern 34. The second inner spacer 42A may extend in the second undercut region UC2. The second inner spacer 42A may be in contact with the bottom surfaces of the plurality of second temporary gate electrodes 32 and with the second active region 22. The second inner spacer 42A may be in contact with the side surface of the lower gate dielectric layer 28.

Referring again to FIGS. 2 and 13, the first gate spacer 41 may be formed on the side surface of the first gate electrode 55. The first gate dielectric layer 53 may be formed between the first gate electrode 55 and the first active region 21 and between the first gate electrode 55 and the first gate spacer 41. The lower gate dielectric layer 28 may have a smaller horizontal width than the second gate electrode 56. The second gate spacer 42 may extend in the second undercut region UC2 between the second active region 22 and the second gate electrode 56.

By way of summation and review, optimized shapes of gate spacers and replacement gate electrodes are required. Therefore, exemplary embodiments provide semiconductor devices with optimized gate spacer shapes, thereby improving electrical properties of the semiconductor devices and methods of forming the same.

That is, according to the exemplary embodiments, a semiconductor device includes a gate spacer on a side surface of a gate electrode, such that the gate spacer extends into an undercut region between the gate electrode and an active region. Due to the gate spacer, defects in the process of forming the gate electrode may be greatly reduced, and therefore, semiconductor devices having excellent electrical properties may be realized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first active region defined on a substrate and including a plurality of channel regions;
a first gate electrode across the first active region and surrounding a top surface, a side surface, and a bottom surface of at least one of the plurality of channel regions;
a first gate dielectric layer between the first active region and the first gate electrode;
a first drain region in the first active region at a position adjacent to the first gate electrode and in contact with each of the plurality of channel regions;
a first gate spacer on a side surface of the first gate electrode;
a second active region defined in a second region on the substrate;
a second gate electrode across the second active region and having a larger horizontal width than the first gate electrode;
a second drain region in the second active region at a position adjacent to the second gate electrode;
an undercut region between the second active region and a metal portion of the second gate electrode; and
a second gate spacer on a side surface of the second gate electrode and protruding into the undercut region; and
a lower gate dielectric layer between the second active region and the second gate electrode and having a smaller horizontal width than the second gate electrode.

2. The semiconductor device as claimed in claim 1, wherein the second gate spacer has a shape of inverted T.

3. The semiconductor device as claimed in claim 1, wherein the second gate spacer includes:
an upper portion on the side surface of the second gate electrode, and
a lower portion extending from the upper portion into the undercut region.

4. The semiconductor device as claimed in claim 3, wherein the lower portion extends between the second active region and the second gate electrode.

5. The semiconductor device as claimed in claim 3, wherein an imaginary straight line, extending along the side surface of the second gate electrode and perpendicular to a surface of the substrate, intersects the lower portion.

6. The semiconductor device as claimed in claim 1, wherein the undercut region is between the metal portion of the second gate electrode and an uppermost channel region of the plurality of channel regions.

7. The semiconductor device as claimed in claim 1, wherein the first gate spacer has a shape of L extending toward outside of the first gate electrode.

8. The semiconductor device as claimed in claim 1, wherein the second gate electrode is on a top surface and a side surface of the second active region, a lower end of the second gate electrode being at a lower level than an upper end of the second active region.

9. A semiconductor device, comprising:
a first active region defined in a first region on a substrate;
a first gate electrode across the first active region;
a first gate dielectric layer between the first active region and the first gate electrode;
a first drain region in the first active region at a position adjacent to the first gate electrode;
a first gate spacer on a side surface of the first gate electrode;
a second active region defined in a second region on the substrate;
a second gate electrode across the second active region and having a larger horizontal width than the first gate electrode;
a second drain region in the second active region at a position adjacent to the second gate electrode;
an undercut region between the second active region and a metal portion of the second gate electrode;
a second gate spacer on a side surface of the second gate electrode and protruding into the undercut region; and
a lower gate dielectric layer between the second active region and the second gate electrode,
wherein a lower end of at least one of the first gate electrode and the second gate electrode is disposed lower than an upper end of one of the first active region corresponding to the first gate electrode and the second active region corresponding to the second gate electrode,
wherein the first active region includes a plurality of channel regions, each of the plurality of channel regions being in contact with the first drain region, and
wherein the first gate electrode surrounds a top surface, a side surface, and a bottom surface of at least one of the plurality of channel regions.

10. The semiconductor device as claimed in claim 9, wherein the second gate spacer includes:
an upper portion on the side surface of the second gate electrode; and
a lower portion extending from the upper portion into the undercut region.

11. The semiconductor device as claimed in claim 10, further comprising:
a second gate dielectric layer extending between the second gate electrode and the second gate spacer, the second gate dielectric layer being in contact with a top surface of the lower portion.

12. The semiconductor device as claimed in claim 10, wherein the lower portion extends between the second active region and the second gate electrode.

13. The semiconductor device as claimed in claim 9, wherein the lower gate dielectric layer has a smaller horizontal width than the second gate electrode.

14. The semiconductor device as claimed in claim 9, wherein
the second gate electrode is on a top surface and a side surface of the second active region.

15. The semiconductor device as claimed in claim 9, wherein:
the first gate spacer has a shape of L extending toward outside of the first gate electrode, and
the second gate spacer has a shape of inverted T.

16. A semiconductor device, comprising:
a first active region defined in a first region on a substrate;
a first gate electrode across the first active region;
a first drain region in the first active region at a position adjacent to the first gate electrode;
a second active region defined in a second region on the substrate;
a second gate electrode across the second active region;
a second drain region in the second active region at a position adjacent to the second gate electrode;
an undercut region between the second active region and a metal portion of the second gate electrode;
a second gate spacer on a side surface of the second gate electrode and protruding into the undercut region;
a lower gate dielectric layer between the second active region and the second gate electrode; and
a second gate dielectric layer extending between the second gate electrode and the second gate spacer,
wherein the second gate spacer has a shape of inverted T,
wherein a lower end of the second gate electrode is disposed lower than an upper end of the second active region,
wherein the first active region includes a plurality of channel regions, each of the plurality of channel regions being in contact with the first drain region, and
wherein the first gate electrode surrounds a top surface, a side surface, and a bottom surface of at least one of the plurality of channel regions.

17. The semiconductor device as claimed in claim 16, wherein the lower gate dielectric layer has a smaller horizontal width than the second gate electrode.

18. The semiconductor device as claimed in claim 16, wherein the second gate spacer includes:
an upper portion on the side surface of the second gate electrode, and
a lower portion extending from the upper portion into the undercut region, and
the second gate dielectric layer is in contact with a top surface of the lower portion.

19. The semiconductor device as claimed in claim 16, further comprising:
a first gate dielectric layer between the first active region and the first gate electrode,
wherein the second gate electrode has a larger horizontal width than the first gate electrode.

* * * * *